United States Patent
Kim

(10) Patent No.: US 11,107,531 B2
(45) Date of Patent: Aug. 31, 2021

(54) SEARCH CIRCUITS, HAMMER ADDRESS MANAGEMENT CIRCUITS, AND MEMORY SYSTEMS INCLUDING THE SAME

(71) Applicant: Samsung Electronics Co., Ltd., Suwon-si (KR)

(72) Inventor: Hyungjin Kim, Uiwang-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 16/806,487

(22) Filed: Mar. 2, 2020

(65) Prior Publication Data

US 2020/0411095 A1     Dec. 31, 2020

(30) Foreign Application Priority Data

Jun. 25, 2019   (KR) .................. 10-2019-0075535

(51) Int. Cl.
  *G11C 15/00*   (2006.01)
  *G11C 15/04*   (2006.01)

(52) U.S. Cl.
  CPC .............. *G11C 15/04* (2013.01); *G11C 15/00* (2013.01); *G11C 15/043* (2013.01); *G11C 15/046* (2013.01)

(58) Field of Classification Search
  CPC ........ G11C 15/04; G11C 15/00; G11C 15/046; G11C 15/043
  See application file for complete search history.

(56) References Cited

U.S. PATENT DOCUMENTS

| | | | |
|---|---|---|---|
| 6,360,344 B1 | 3/2002 | Khoche et al. | |
| 6,373,738 B1* | 4/2002 | Towler | G11C 15/04 365/189.07 |
| 6,775,166 B2* | 8/2004 | McKenzie | G11C 15/00 365/189.07 |
| 6,816,396 B2 | 11/2004 | Chai et al. | |
| 7,433,219 B2 | 10/2008 | Kawabata et al. | |
| 7,760,530 B2* | 7/2010 | Cavanna | G11C 15/00 365/49.17 |
| 7,813,154 B2 | 10/2010 | Kawabata et al. | |
| 7,975,192 B2 | 7/2011 | Sommer et al. | |
| 8,023,341 B2 | 9/2011 | Kawabata et al. | |
| 9,384,821 B2 | 7/2016 | Bains et al. | |
| 9,672,912 B2* | 6/2017 | Matsuoka | G11C 15/04 |

(Continued)

FOREIGN PATENT DOCUMENTS

KR   100912518   8/2009

*Primary Examiner* — Pho M Luu
(74) *Attorney, Agent, or Firm* — Myers Bigel, P.A.

(57) ABSTRACT

A search circuit includes a content-addressable memory (CAM) including a plurality of CAM cells configured to store a plurality of entry data, each entry data including a first bit corresponding to a least significant bit through a K-th bit corresponding to a most significant bit, the CAM configured to provide a plurality of matching signals indicating whether each of the plurality of entry data matches searching data, and a CAM controller configured to perform a partial searching operation such that the CAM controller applies comparison bits corresponding to a portion of the first through K-th bits as the searching data to the CAM and searches for target entry data among the plurality of entry data based on the plurality of matching signals indicating that the corresponding bits of the target entry data match the comparison bits.

20 Claims, 27 Drawing Sheets

(56) References Cited

U.S. PATENT DOCUMENTS

| | | |
|---|---|---|
| 9,812,185 B2 | 11/2017 | Fisch et al. |
| 2015/0370708 A1 | 12/2015 | Butler et al. |
| 2019/0066808 A1 | 2/2019 | Nale |

* cited by examiner

FIG. 10A

| | B6 | B5 | B4 | B3 | B2 | B1 | DECIMAL | |
|---|---|---|---|---|---|---|---|---|
| ENT1 | 0 | 0 | 0 | 0 | 1 | 0 | 2 | |
| ENT2 | 0 | 1 | 1 | 0 | 1 | 1 | 27 | ← MAXENT |
| ENT3 | 0 | 0 | 0 | 0 | 0 | 1 | 1 | |
| ENT4 | 0 | 0 | 1 | 1 | 0 | 0 | 12 | |
| ENT5 | 0 | 0 | 0 | 1 | 1 | 1 | 7 | |

FIG. 10B

| | SEARCH DATA | | | | | | MATCHING SIGNALS | | | | |
|---|---|---|---|---|---|---|---|---|---|---|---|
| | B6 | B5 | B4 | B3 | B2 | B1 | MAT1 | MAT2 | MAT3 | MAT4 | MAT5 |
| PC01 | 1 | DCV | DCV | DCV | DCV | DCV | 0 | 0 | 0 | 0 | 0 |
| PC02 | 0 | 1 | DCV | DCV | DCV | DCV | 0 | (1) | 0 | 0 | 0 |

MAXENT

FIG. 11A

|  | B6 | B5 | B4 | B3 | B2 | B1 | DECIMAL |  |
|---|---|---|---|---|---|---|---|---|
| ENT1 | 0 | 0 | 0 | 0 | 1 | 0 | 2 |  |
| ENT2 | 0 | 1 | 0 | 1 | 1 | 1 | 23 | ← MAXENT |
| ENT3 | 0 | 0 | 0 | 0 | 0 | 1 | 1 |  |
| ENT4 | 0 | 1 | 0 | 0 | 1 | 0 | 18 |  |
| ENT5 | 0 | 0 | 0 | 1 | 1 | 1 | 7 |  |

FIG. 11B

|  | SEARCH DATA | | | | | | MATCHING SIGNALS | | | | |
|---|---|---|---|---|---|---|---|---|---|---|---|
|  | B6 | B5 | B4 | B3 | B2 | B1 | MAT1 | MAT2 | MAT3 | MAT4 | MAT5 |
| PC01 | 1 | DCV | DCV | DCV | DCV | DCV | 0 | 0 | 0 | 0 | 0 |
| PC02 | 0 | 1 | DCV | DCV | DCV | DCV | 0 | 1 | 0 | 1 | 0 |
| PC03 | 0 | 1 | 1 | DCV | DCV | DCV | 0 | 0 | 0 | 0 | 0 |
| PC04 | 0 | 1 | 0 | 1 | DCV | DCV | 0 | ①  | 0 | 0 | 0 |

↑
MAXENT

FIG. 13A

| | B6 | B5 | B4 | B3 | B2 | B1 | DECIMAL | |
|---|---|---|---|---|---|---|---|---|
| ENT1 | 0 | 0 | 0 | 0 | 1 | 0 | 2 | ← MINENT |
| ENT2 | 0 | 1 | 1 | 0 | 1 | 1 | 27 | |
| ENT3 | 0 | 0 | 0 | 1 | 0 | 1 | 5 | |
| ENT4 | 0 | 0 | 1 | 1 | 0 | 0 | 12 | |
| ENT5 | 0 | 0 | 0 | 1 | 1 | 1 | 7 | |

FIG. 13B

| | SEARCH DATA | | | | | | MATCHING SIGNALS | | | | |
|---|---|---|---|---|---|---|---|---|---|---|---|
| | B6 | B5 | B4 | B3 | B2 | B1 | MAT1 | MAT2 | MAT3 | MAT4 | MAT5 |
| PC01 | 0 | DCV | DCV | DCV | DCV | DCV | 1 | 1 | 1 | 1 | 1 |
| PC02 | 0 | 0 | DCV | DCV | DCV | DCV | 1 | 0 | 1 | 1 | 1 |
| PC03 | 0 | 0 | 0 | DCV | DCV | DCV | 1 | 0 | 1 | 0 | 1 |
| PC04 | 0 | 0 | 0 | 0 | DCV | DCV | (1) | 0 | 0 | 0 | 0 |

↑ MINENT

FIG. 14A

|      | B6 | B5 | B4 | B3 | B2 | B1 | DECIMAL |
|------|----|----|----|----|----|----|---------|
| ENT1 | 0  | 0  | 0  | 1  | 1  | 0  | 6       |
| ENT2 | 0  | 1  | 1  | 0  | 1  | 1  | 27      |
| ENT3 | 0  | 0  | 0  | 1  | 0  | 1  | 5       ← MINENT
| ENT4 | 0  | 0  | 1  | 1  | 0  | 0  | 12      |
| ENT5 | 0  | 0  | 0  | 1  | 1  | 1  | 7       |

FIG. 14B

|      | SEARCH DATA ||||||  MATCHING SIGNALS |||||
|------|----|-----|-----|-----|-----|-----|------|------|------|------|------|
|      | B6 | B5  | B4  | B3  | B2  | B1  | MAT1 | MAT2 | MAT3 | MAT4 | MAT5 |
| PC01 | 0  | DCV | DCV | DCV | DCV | DCV | 1    | 1    | 1    | 1    | 1    |
| PC02 | 0  | 0   | DCV | DCV | DCV | DCV | 1    | 0    | 1    | 1    | 1    |
| PC03 | 0  | 0   | 0   | DCV | DCV | DCV | 1    | 0    | 1    | 0    | 1    |
| PC04 | 0  | 0   | 0   | 0   | DCV | DCV | 0    | 0    | 0    | 0    | 0    |
| PC05 | 0  | 0   | 0   | 1   | 0   | DCV | 0    | 0    | (1)  | 0    | 0    |

↑ MINENT

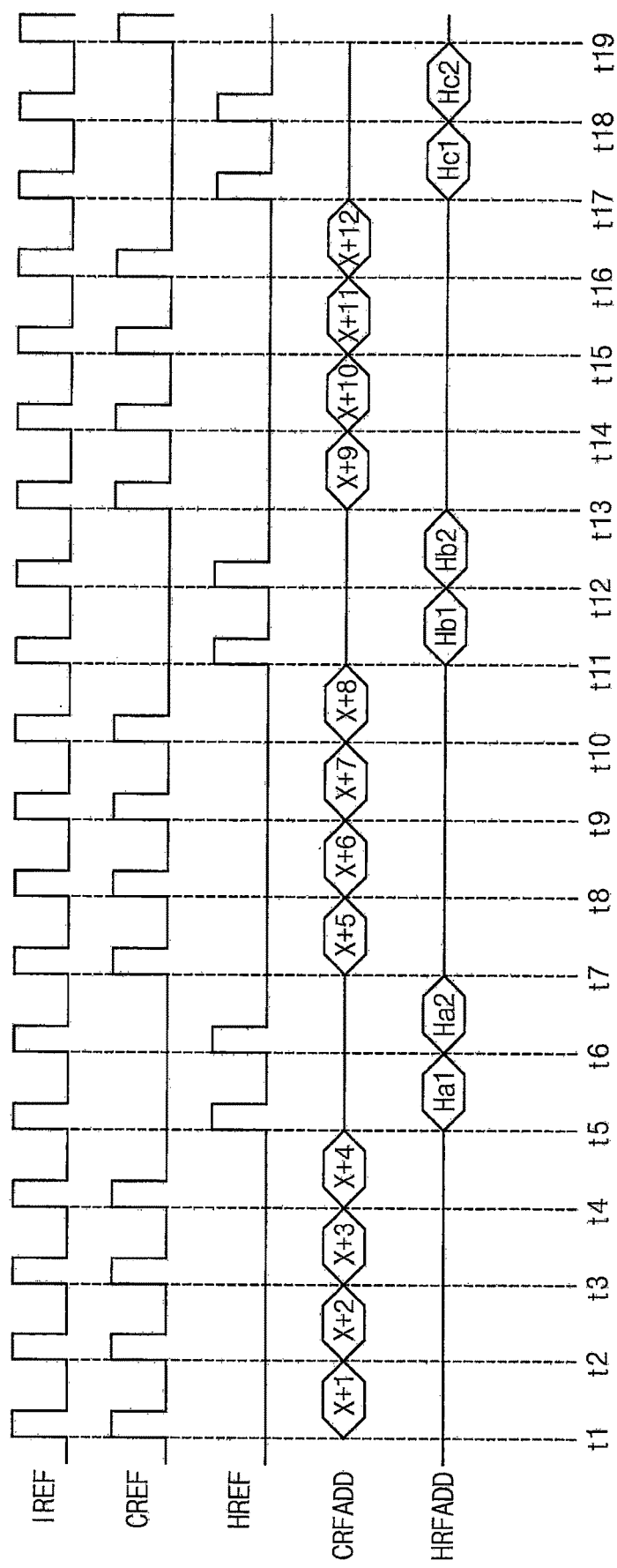

SEARCH CIRCUITS, HAMMER ADDRESS MANAGEMENT CIRCUITS, AND MEMORY SYSTEMS INCLUDING THE SAME

CROSS-REFERENCE TO RELATED APPLICATION

This U.S. non-provisional application claims priority under 35 U.S.C. § 119 to Korean Patent Application No. 10-2019-0075535, filed on Jun. 25, 2019, in the Korean Intellectual Property Office (KIPO), the disclosure of which is incorporated by reference herein in its entirety.

BACKGROUND

1. Technical Field

Example embodiments relate generally to semiconductor integrated circuits, and more particularly to search circuits, hammer address management circuits, and memory systems including the search circuit.

2. Discussion of the Related Art

A content-addressable memory (CAM) is a kind of memory capable of performing a high-speed parallel data search for entry data stored therein. The CAM may realize a function of a look-up table in one clock cycle using dedicated comparison circuits implemented in the CAM cells. Particularly, the CAM may be used in technical fields requiring high-speed parallel data searches, such as a network router for packet forwarding. In general, the CAM is used to determine whether the stored entry data match searching data and the fields capable of the inherent comparison function of the CAM.

SUMMARY

Some example embodiments may provide search circuits capable of searching for data satisfying a particular condition using a CAM.

Some example embodiments may provide a hammer address management circuit and a memory system including the search circuit.

According to example embodiments of the present disclosure, a search circuit includes a content-addressable memory (CAM) including a plurality of CAM cells configured to store a plurality of entry data, each entry data including a first bit corresponding to a least significant bit through a K-th bit corresponding to a most significant bit, the CAM configured to provide a plurality of matching signals indicating whether each of the plurality of entry data matches searching data, and a CAM controller configured to perform a partial searching operation such that the CAM controller applies comparison bits corresponding to a portion of the first through K-th bits as the searching data to the CAM and searches for target entry data among the plurality of entry data based on the plurality of matching signals indicating that the corresponding bits of the target entry data match the comparison bits.

According to example embodiments of the present disclosure, a memory system includes a memory cell array including a plurality of memory cells, a hammer address management circuit configured to determine a hammer address of the memory cell array that is accessed intensively, and a refresh controller configured to perform a hammer refresh operation to refresh a first row of the memory cell array that is physically adjacent to a second row of the memory cell array corresponding to the hammer address. The hammer address management circuit includes an address storage configured to store a plurality of row addresses based on an access address signal, a content-addressable memory (CAM) including a plurality of CAM cells configured to store a plurality of access count data indicating a plurality of access counts of the plurality of row addresses, each access count data including a first bit corresponding to a least significant bit through a K-th bit corresponding to a most significant bit, the CAM configured to provide a plurality of matching signals indicating whether each of the plurality of access count data matches searching data, a CAM controller configured to perform a partial searching operation such that the CAM controller applies comparison bits corresponding to a portion of the first through K-th bits as the searching data to the CAM and searches for target count data among the plurality of access count data based on the plurality of matching signals indicating that the corresponding bits of the target count data match the comparison bits, and an address controller configured to provide the hammer address among the plurality of row addresses stored in the address storage, based on a result of searching for the target count data.

According to example embodiments, a hammer address management circuit of a memory system, includes, an address storage configured to store a plurality of row addresses based on an access address signal provided to a memory device, a content-addressable memory (CAM) including a plurality of CAM cells configured to store a plurality of access count data indicating a plurality of access counts of the plurality of the plurality of row addresses, each access count data including a first bit corresponding to a least significant bit through a K-th bit corresponding to a most significant bit, the CAM configured to provide a plurality of matching signals indicating whether each of the plurality of access count data matches searching data, and a CAM controller configured to perform a partial searching operation such that the CAM controller applies comparison bits corresponding to a portion of the first through K-th bits as the searching data to the CAM and search for target count data among the plurality of access count data based on the plurality of matching signals indicating that the corresponding bits of the target count data match the comparison bits and an address controller configured to provide a hammer address of the memory device that is accessed intensively, based on a result of searching for the target count data.

The search circuits according to example embodiments may replace various circuits such as comparators for applying various conditions, and sizes of the various circuits for searching for data of a particular condition may be reduced by using the CAM.

In addition, the hammer address management circuit and the memory system may reduce a size of circuit for the hammer refresh operation using the search circuit.

BRIEF DESCRIPTION OF THE DRAWINGS

Example embodiments of the present disclosure will be more clearly understood from the following detailed description taken in conjunction with the accompanying drawings.

FIGS. 10A, 10B, 11A, and 11B are diagrams illustrating examples of the maximum entry searching method of FIG. 9.

FIGS. 13A, 13B, 14A, and 14B are diagrams illustrating examples of the minimum entry searching method of FIG. 12.

FIGS. 20A, 20B, and 20C are timing diagrams illustrating example operations of a refresh controller included in a memory device according to example embodiments of the present disclosure.

DETAILED DESCRIPTION

Figure 1:
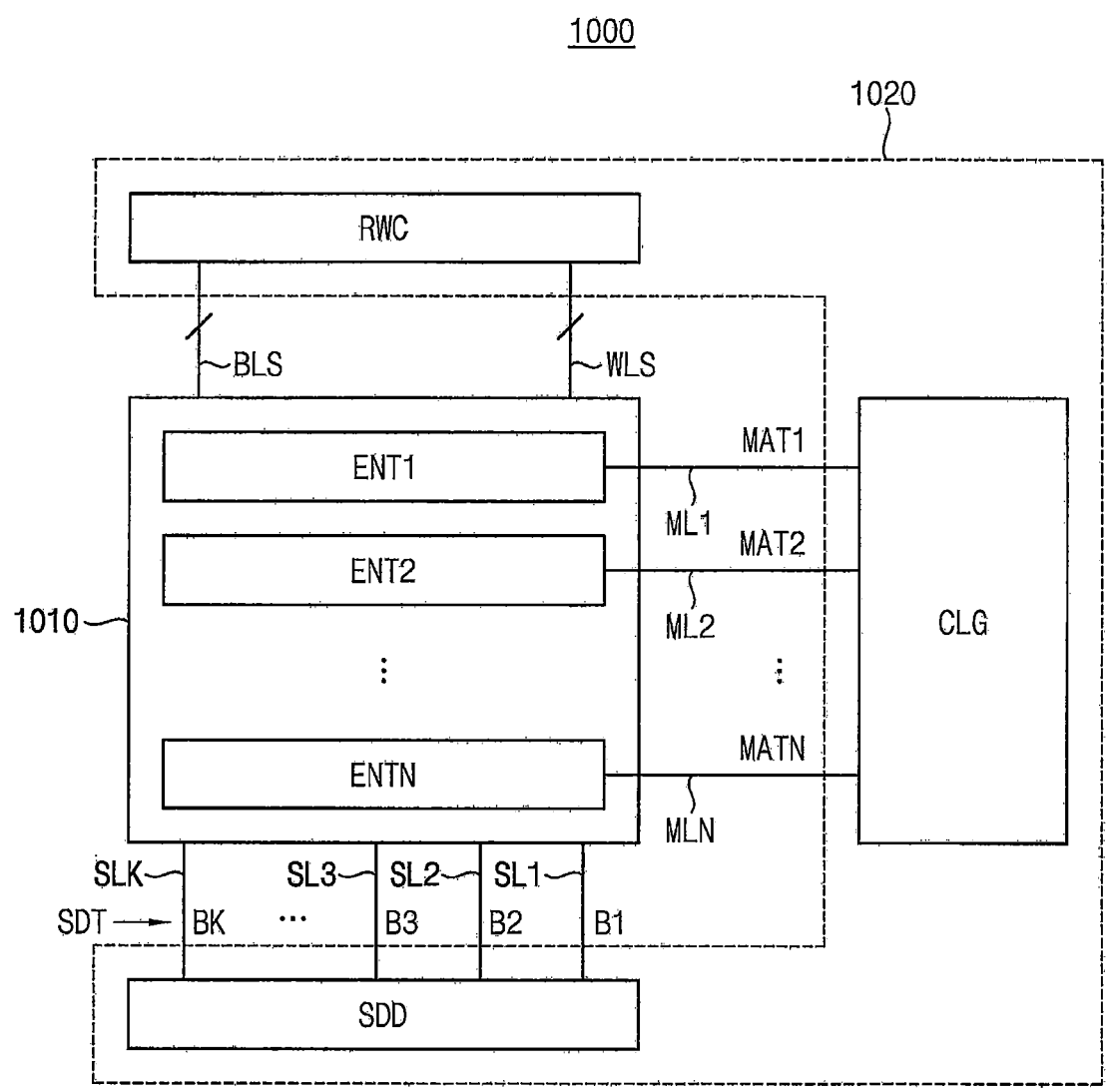
FIG. 1 is a block diagram illustrating a search circuit according to example embodiments of the present disclosure.

Various example embodiments will be described more fully hereinafter with reference to the accompanying drawings, in which some example embodiments are shown. In the drawings, like numerals refer to like elements throughout. The repeated descriptions may be omitted. Thus, the same or similar numbers may be described with reference to other drawings even if they are neither mentioned nor described in the corresponding drawing. Also, elements that are not denoted by reference numbers may be described with reference to other drawings FIG. 1 is a block diagram illustrating a search circuit 1000 according to example embodiments of the present disclosure.

Referring to FIG. 1, the search circuit 1000 includes a content-addressable memory (CAM) 1010 and a CAM controller 1020.

The CAM 1010 may store a plurality of entry data ENT1 to ENTN (e.g., ENT1, ENT2, . . . , ENTN). As will be described with reference to FIG. 2, the CAM 1010 may include a plurality of CAM cells configured to store the plurality of entry data ENT1 to ENTN, where each entry data includes a first bit corresponding to a least significant bit through a K-th bit corresponding to a most significant bit, where K is a natural number. In some embodiments, the CAM 1010 is a binary CAM (BCAM) that stores a value of 0 or a value of 1 to each bit of the first through K-th bits of the plurality of entry data.

The CAM 1010 may receive searching data SDT from the CAM controller 1020 and may provide a plurality of matching signals MAT1 to MATN (e.g., MAT1, MAT2, . . . , MATN) indicating whether each of the plurality of entry data ENT1 to ENTN matches the searching data SDT.

The CAM controller 1020 may search for target entry data among the plurality of entry data ENT1 to ENTN based on the plurality of matching signals MAT1 to MATN. The CAM controller 1020 may perform a partial searching operation for searching for the target entry data. The partial searching operation may indicate that the CAM controller 1020 applies comparison bits corresponding to a portion of the first through K-th bits B1 to BK (e.g., B1, B2, B3, . . . , BK) as the searching data SDT to the CAM 1010 and determines whether the bits of the plurality of entry data ENT1 to ENTN corresponding to the comparison bits match the comparison bits. Examples of the partial searching operation will be described below with reference to FIGS. 3A through 4B. In this disclosure, B1 to BK may be used to indicate bit positions regardless and/or independent of the plurality of the entry data ENT1 to ENTN or the searching data SDT. As used herein, the term "and/or" includes any and all combinations of one or more of the associated listed items.

The CAM controller 1020 may include a searching data driver SDD, a read-write circuit RWC, and a control logic CLG.

The read-write circuit RWC may be connected to the CAM 1010 through a plurality of bitlines BLS and a plurality of wordlines WLS to write the entry data to the CAM 1010 or read the entry data stored in the CAM 1010. The CAM cells included in the CAM 1010 may have various configurations and the read-write circuit RWC may have various configurations suitable for and/or compatible with a configuration of the CAM cells.

The control logic CLG may control the partial searching operation. The control logic CLG may determine comparison bits based on the target entry data to be searched for, and provide the searching data SDT including the comparison bits to the searching data driver SDD. The control logic CLG may be connected to the CAM 1010 through a plurality of matching lines ML1 to MLN (e.g., ML1, ML2, . . . , MLN). The control logic CLG may search for the target entry data among the plurality of entry data ENT1 to ENTN based on the plurality of matching signals MAT1 to MATN provided through the plurality of matching lines ML1 to MLN. The control logic CLG may be implemented as software, hardware, and/or a combination thereof.

The searching data driver SDD may be connected to the CAM 1010 through a plurality of searching lines SL1 to SLK (e.g., SL1, SL2, SL3, . . . , SLK). The searching data driver SDD may latch the searching data SDT provided from the control logic CLG and apply the searching data SDT to the CAM 1010 through the plurality of searching lines SL1 to SLK.

Using the partial searching operation, the target entry data satisfying various conditions may be searched for among the plurality of entry data ENT1 to ENTN stored in the CAM 1010. The CAM controller 1020 may repeat the partial searching operation by changing the comparison bits until the target entry data are determined. In this disclosure, "searching for the target entry data" may include determining a target position of the CAM 1010 in which the target entry data are stored. The target position may be represented by various forms such as an address, a pointer, and so on. The information on the target position may be provided to the read-write circuit RWC and the read-write circuit RWC may read out the target entry data from the CAM 1010 based on the target position.

In some example embodiments, the CAM controller 1020 may repeat the partial searching operation by increasing a number of the comparison bits one by one in a direction from the K-th bit BK to the first bit B1. The sequential and repeated partial searching operation may be referred to as a 1-bit accumulation searching operation. As will be described with reference to FIGS. 9 through 14B, using the 1-bit accumulation searching operation, maximum entry data or minimum entry data may be determined as the target entry data among the plurality of entry data ENT1 to ENTN.

As such, the search circuit according to example embodiments may replace various circuits such as comparators for applying various conditions and sizes of the various circuits may be reduced by searching for data of a particular condition, using the CAM.

Figure 2:
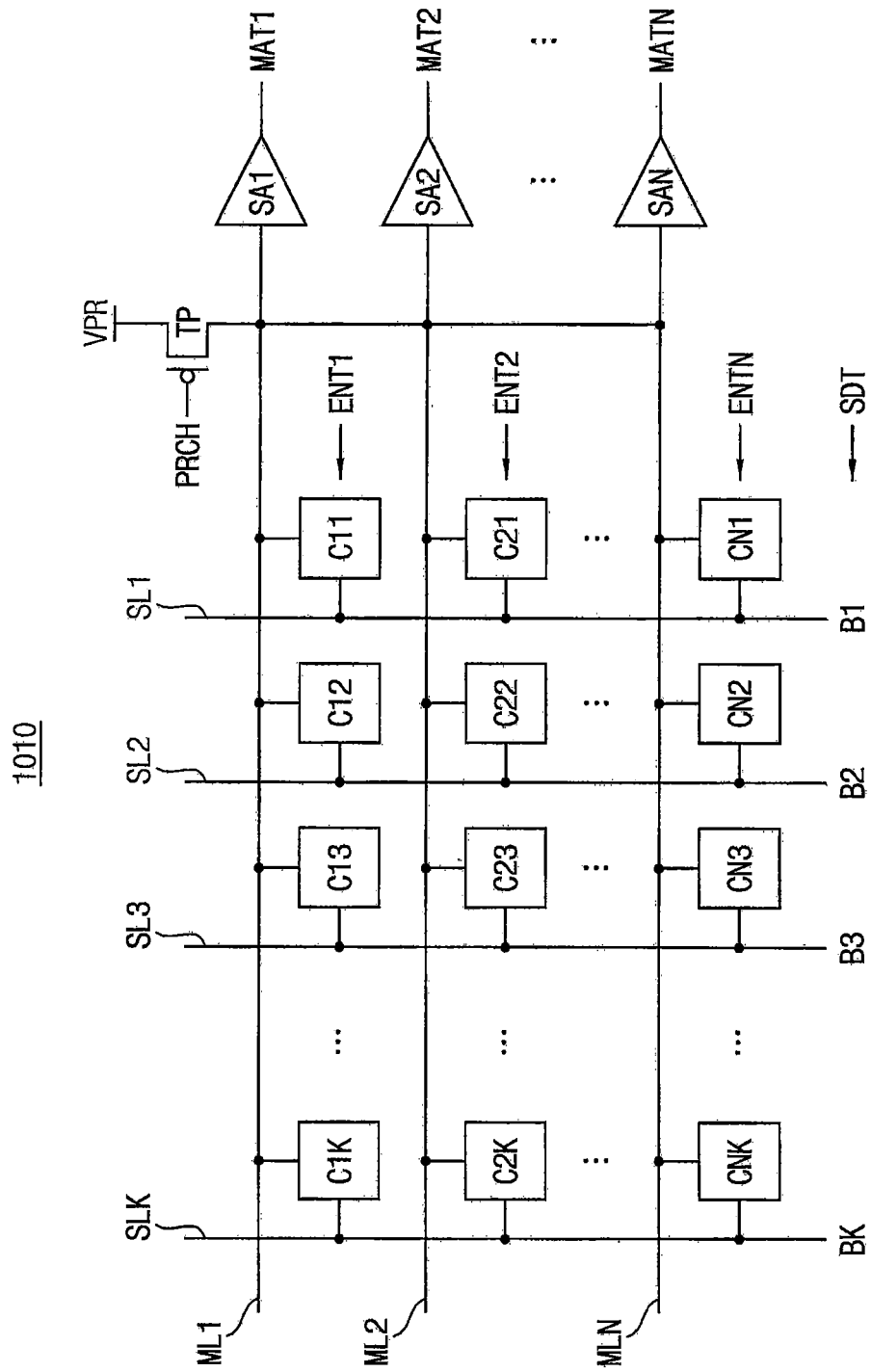
FIG. 2 is a diagram illustrating a schematic configuration of a content-addressable memory (CAM) included in the search circuit of FIG. 1.

FIG. 2 is a diagram illustrating a schematic configuration of a content-addressable memory (CAM) included in the search circuit of FIG. 1.

Referring to FIG. 2, a CAM 1010 may include a plurality of CAM cells C11 to CNK (e.g., C11, C12, C13, . . . , C1K, C21, C22, C23, . . . , C2K, . . . , CN1, CN2, CN3, . . . , CNK), where N and K are natural numbers, a precharge circuit TP, and a plurality of sense amplifiers SA1 to SAN (e.g., SA1, SA2, . . . , SAN).

The plurality of CAM cells C11 to CNK may be arranged in a matrix form of N rows and K columns, and the K CAM cells corresponding to one row may store one entry data including a first bit B1 corresponding to a least significant bit through a K-th bit corresponding to a most significant bit BK. In other words, the CAM cells C11 to C1K (e.g., C11, C12, C13, . . . , C1K) of the first row may store the first entry data ENT1 including the K bits, the CAM cells C21 to C2K (e.g., C21, C22, C23, . . . , C2K) of the second row may store the first entry data ENT2 including the K bits, and the CAM cells CN1 to CNK (e.g., CN1, CN2, CN3, . . . , CNK) of the N-th row may store the N-th entry data ENTN including the K bits.

The CAM cells of the same row may be commonly connected to the same matching line. In other words, the CAM cells C11 to C1K of the first row may be commonly connected to the first matching line ML1, the CAM cells C21 to C2K of the second row may be commonly connected to the second matching line ML2, and the CAM cells CN1 to CNK of the N-th row may be commonly connected to the N-th matching line MLN.

The CAM cells of the same column may be commonly connected to the same searching line. In other words, the CAM cells C11 to CN1 (e.g., C11, C21, . . . , CN1) of the first column may be commonly connected to the first searching line SL1, the CAM cells C12 to CN2 (e.g., C12, C22, . . . , CN2) of the second column may be commonly connected to the second searching line SL2, and the CAM cells C1K to CNK (e.g., C1K, C2K, . . . , CNK) of the K-th column may be commonly connected to the K-th searching line SLK.

The plurality of sense amplifiers SA1 to SAN may sense and amplify voltages of the plurality of matching lines ML1 to MLN to provide a plurality of matching signals MAT1 to MATN. According to example embodiments, the sense amplifiers SA1 to SAN may be omitted, or may be included in the control logic CLG in FIG. 1.

The precharge circuit TP may precharge the plurality of matching lines ML1 to MLN with a precharge voltage VPR. FIG. 2 illustrates that one precharge circuit TP may precharge commonly the plurality of matching lines ML1 to MLN as a non-limiting example. According to example embodiments, the respective precharge circuit TP may be assigned to each matching line. The configuration of the precharge circuit TP may be implemented variously.

FIG. 2 illustrates a simplified configuration of the CAM 1010. The searching data SDT including the first through K-th bits B1 to BK may be transmitted through the first through K-th searching lines SL1 to SLK, and the comparison results between the plurality of entry data ENT1 to ENTN and the searching data SDT may be provided to the plurality of sense amplifiers SA1 to SAN through the plurality of matching lines ML1 to MLN.

As the comparison results, each matching signal MATi (where i includes natural numbers from 1 to N) may have a first logic level (for example, a logic high level) indicating a match case when the comparison bits of the searching data SDT match the corresponding bits of each entry data ENTi, and each matching signal MATi may have a second logic level (for example, a logic low level) indicating a mismatch case when the comparison bits of the searching data SDT do not match the corresponding bits of each entry data ENTi. In this disclosure, the logic high level may be equal to a value of 1 and the logic low level may be equal to a value of 0, but the present disclosure is not limited thereto.

Figure 5:
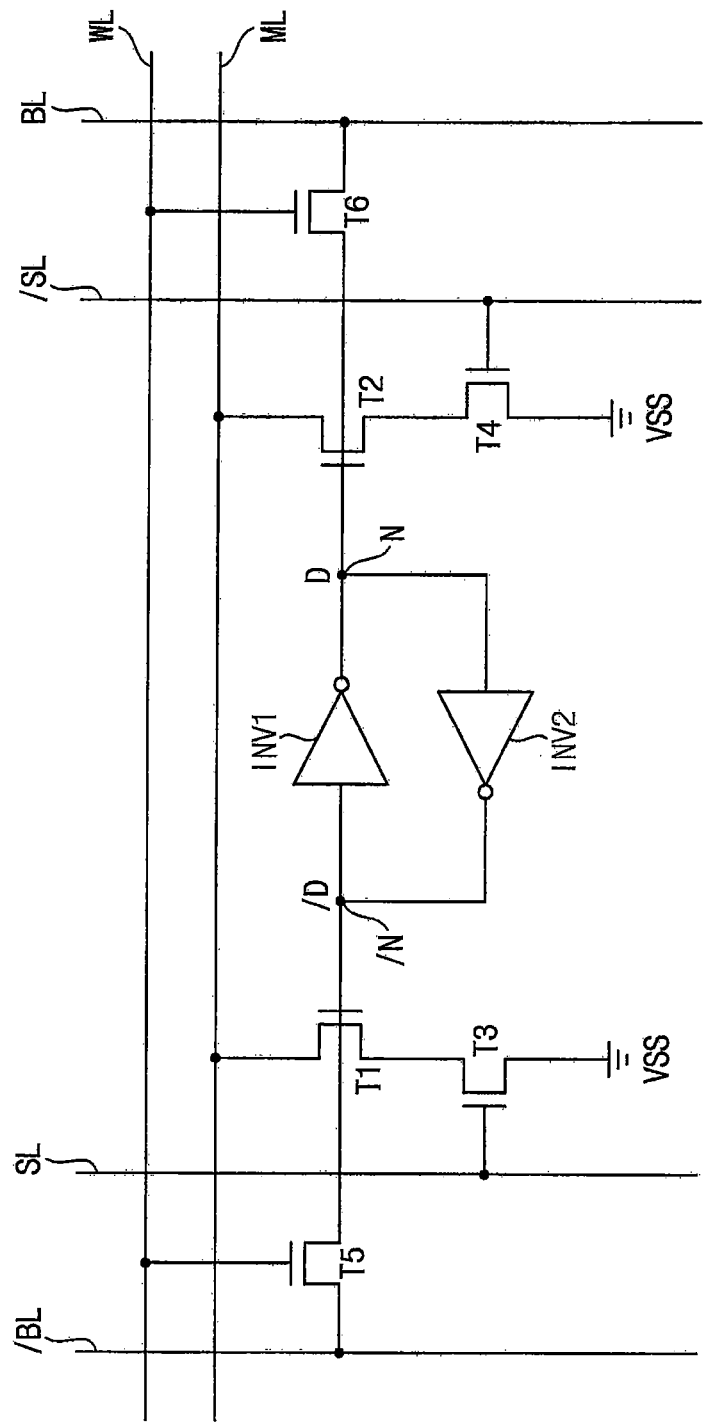
FIG. 5 is a circuit diagram illustrating an example CAM cell included in a CAM.

The searching operation of the CAM 1010 may include a searching line precharge operation, a matching line precharge operation, and a comparison operation. For example, when the CAM cells have a configuration as illustrated in FIG. 5, the searching lines may be precharged to the logic low level by enabling and then disabling pull-down paths in the CAM cells. While the pull-down paths are disabled, the matching lines are precharged to the logic high level using the precharge circuit. After such precharge operations, the comparison operation may be performed by applying the searching data to the searching lines.

In the match case, all of the pull-down paths in the CAM cells connected to the same matching line may be disabled and thus the matching line may maintain the logic high level or the value of 1.

In the match case, at least one of the pull-down paths in the CAM cells connected to the same matching line may be enabled and thus the matching line may be discharged to the logic low level or the value of 0.

FIGS. 3A, 3B, 4A, and 4B are diagrams illustrating examples of a partial searching operation performed by a search circuit according to example embodiments of the present disclosure.

Even though a 6-bit configuration corresponding to one row is illustrated FIGS. 3A, 3B, 4A and 4B for convenience of illustration and description, the bit number may be determined variously.

The first through sixth bits of the entry data ENT are stored in the first through sixth CAM cells C1 to C6 (e.g., C1, C2, C3, C4, C5, and C6), and the first through sixth bits B1 to B6 (e.g., B1, B2, B3, B4, B5, and B6) of the searching data SDT may be applied to the first through sixth CAM cells C1 to C6 through the first through sixth searching lines SL1 to SL6 (e.g., SL1, SL2, SL3, SL4, SL5, and SL6). For example, it is illustrated by way of example that the first through sixth CAM cells C1 to C6 have values 0, 1, 0, 1, 1, and 0, respectively.

Among the first through sixth bits B1 to B6 of the searching data SDT, the rest of the bits except the above-described comparison bits may be referred to as non-comparison bits. Each of the comparison bits may have a value of 0 or 1, and all of the non-comparison bits may have a "don't care" value DCV. The don't care value DCV may indicate a value that may disable the pull-down path of the CAM cell regardless and/or independently of the value stored in the CAM cell, and the don't care value DCV may be implemented variously depending on the configuration of the CAM cell.

Figure 3A:
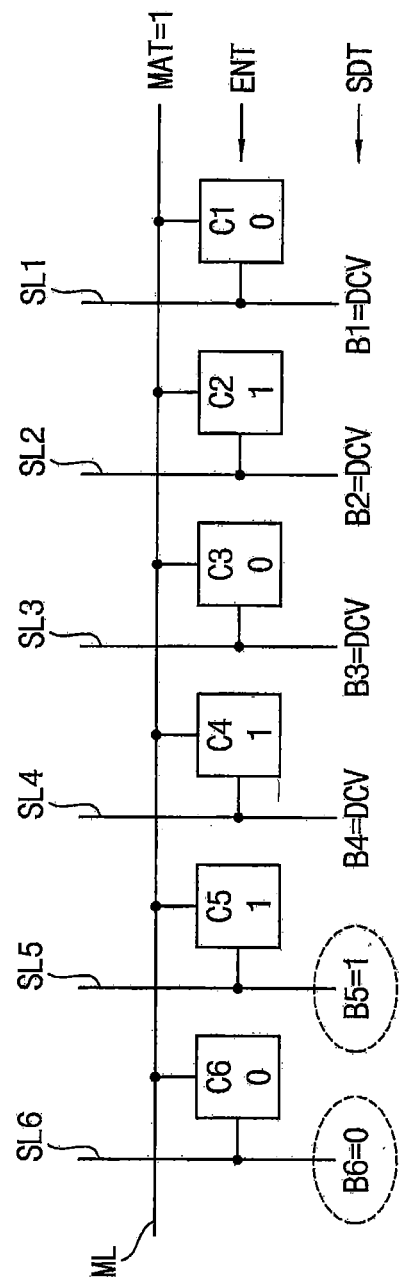
FIGS. 3A, 3B, 4A, and 4B are diagrams illustrating examples of a partial searching operation performed by a search circuit according to example embodiments of the present disclosure.
Figure 3B:
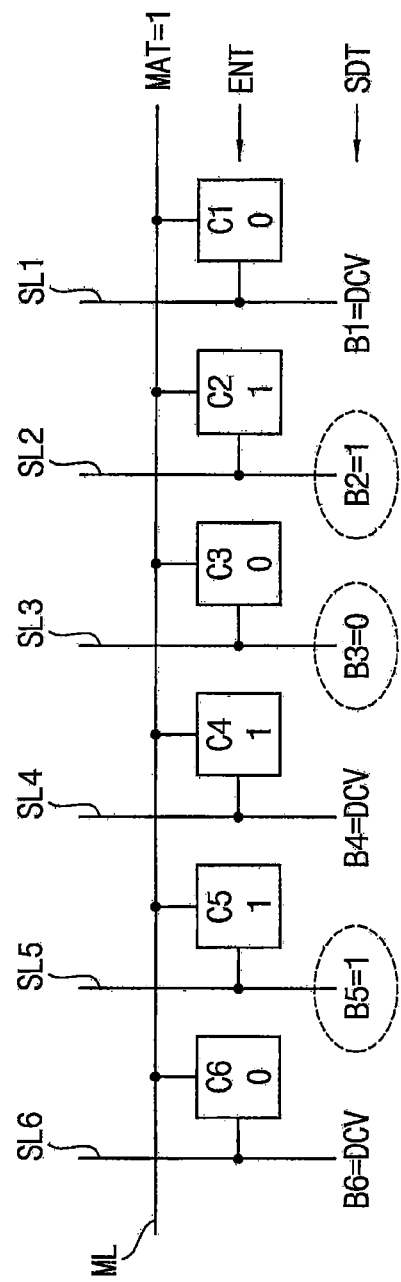

FIGS. 3A and 3B represent a partial searching operation corresponding to a match case.

Referring to FIG. 3A, the sixth bit B6 and the fifth bit B5 of the searching data SDT correspond to the comparison bits, and the fourth bit B4, the third bit B3, the second bit B2, and the first bit B1 correspond to the non-comparison bits. The non-comparison bits B4, B3, B2, and B1 do not affect the comparison results, that is, the logic level or the value of the matching signal MAT. Accordingly, the matching signal MAT may have the value of 1 indicating the match case because all of the comparison bits B6 and B5 of the searching data SDT match the corresponding bits of the entry data ENT. For example, comparison bit B6 has a value of 0 and corresponding CAM cell C6 has a value of 0, and comparison bit B5 has a value of 1 and corresponding CAM cell C5 has a value of 1.

Referring to FIG. 3B, the fifth bit B5, the third bit B3, and the second bit B2 of the searching data SDT correspond to the comparison bits, and the sixth bit B6, the fourth bit B4, and the first bit B1 correspond to the non-comparison bits. The non-comparison bits B6, B4, and B1 do not affect the value of the matching signal MAT. Accordingly, the matching signal MAT may have the value of 1 indicating the match case because all of the comparison bits B5, B3, and B2 of the searching data SDT match the corresponding bits of the entry data ENT. For example, comparison bit B5 has a value of 1 and corresponding CAM cell C5 has a value of 1, comparison bit B3 has a value of 0 and corresponding CAM cell C3 has a value of 0, and comparison bit B2 has a value of 1 and corresponding CAM cell C2 has a value of 1.

Figure 4A:
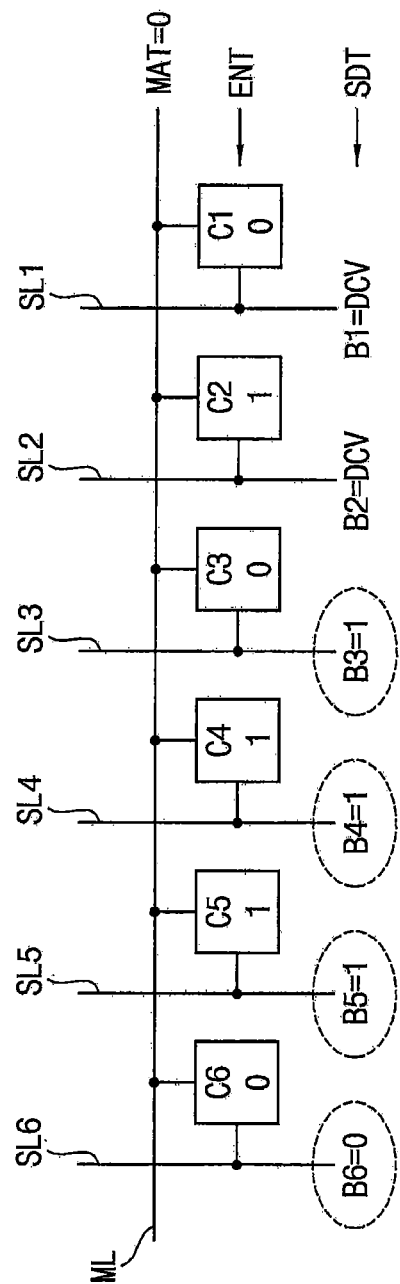
Figure 4B:
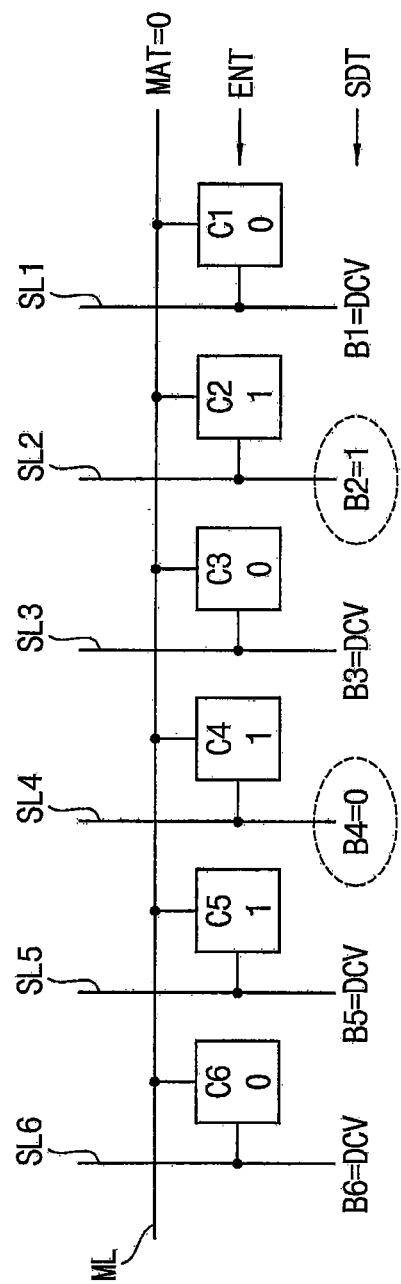

FIGS. 4A and 4B represent a partial searching operation corresponding to a mismatch case.

Referring to FIG. 4A, the sixth bit B6, the fifth bit B5, the fourth bit B4, and the third bit B3 of the searching data SDT correspond to the comparison bits, and the second bit B2 and the first bit B1 correspond to the non-comparison bits. The non-comparison bits B2 and B1 do not affect the value of the matching signal MAT. Accordingly, the matching signal MAT may have the value of 0 indicating the mismatch case because at least one of the comparison bits B6, B5, B4 and B3, of the searching data SDT, that is, the third bit B3 mismatches the corresponding bit of the entry data ENT. For example, comparison bit B3 has a value of 1 while the corresponding CAM cell C3 has a value of 0.

Referring to FIG. 4B, the fourth bit B4 and the second bit B2 of the searching data SDT correspond to the comparison bits, and the sixth bit B6, the fifth bit B5, the third bit B3, and the first bit B1 correspond to the non-comparison bits. The non-comparison bits B6, B5, B3, and B1 do not affect the value of the matching signal MAT. Accordingly, the matching signal MAT may have the value of 0 indicating the mismatch case because at least one of the comparison bits B4 and B2 of the searching data SDT, that is, the fourth bit B4 mismatches the corresponding bit of the entry data ENT. For example, comparison bit B4 has a value of 0 while the corresponding CAM cell C4 has a value of 1.

The various searching conditions may be implemented using a combination and/or a sequence of a plurality of partial searching operations illustrated as in FIGS. 3A through 4B.

FIG. 5 is a circuit diagram illustrating an example CAM cell included in a CAM.

A NOR-type CAM cell modified from a static random access memory (SRAM) cell is illustrated in FIG. 5 as an example. The CAM cell according to example embodiments is not limited to the configuration of FIG. 5.

Referring to FIG. 5, a CAM cell may include first and second inverters INV1 and INV2 forming a latch, and first through sixth transistors T1 to T6 (e.g., T1, T2, T3, T4, T5, and T6), which may be N-type metal oxide semiconductor (NMOS) transistors.

The fifth and sixth transistors T5 and T6 are associated with a read operation and/or a write operation of the CAM cell. The fifth and sixth transistors T5 and T6 may electrically connect a normal bitline BL and a complementary bitline/BL to a latch node N and an inversion node/N, respectively, based on a voltage of a wordline that is driven by the read-write circuit RWC in FIG. 1. In the read operation, a normal bit value D of the latch node N and an inversion bit value/D of the inversion node/N may be provided to the read-write circuit RWC through the normal bitline BL and the complementary bitline/BL, respectively. In the write operation, the normal bit value D and the inversion bit value/D may be loaded to the normal bitline BL and the complementary bitline/BL to be stored in the latch node N and the inversion node/N, respectively. The read operation and the write operation may be substantially the same as those of the SRAM cell, and further descriptions are omitted.

The first transistor T1 is turned on in response to the inversion bit value/D stored in the inversion node/N, and the second transistor T2 is turned on in response to the normal bit value D stored in the latch node N. The third transistor T3 is turned on in response to a bit value applied through a normal searching line SL, and the fourth transistor T4 is turned on in response to a bit value applied through a complementary searching line/SL.

The NOR-type CAM cell of FIG. 5 includes a first pull-down path including the first transistor T1 and the third transistor T3, and a second pull-down path including the second transistor T2 and the fourth transistor T4. As described above, the match line ML is precharged to the logic high level and then the first and second pull-down paths may be selectively enabled depending on the bit values applied through of the normal searching line SL and the complementary searching line/SL and the stored value D and/D. When at least one of the first and second pull-down paths is enabled, the matching line ML is discharged to the ground voltage VSS, and as a result the voltage of the matching line ML transitions from the logic high level corresponding the value of 1 to the logic low level corresponding to the value of 0. When both of the first and second pull-down paths are disabled, the matching line ML maintains the precharged voltage, that is, the logic high level corresponding to the value of 1.

FIGS. 6A, 6B, 7A, 7B, 8A, and 8B are diagrams for describing bit values of searching data applied to a CAM.

One bit value of the searching data may be represented by a combination (SL,/SL) of the bit value of the normal searching line SL and the bit value of the complementary searching line/SL. In addition, one bit value of the entry data stored in the CAM cell may be represented by a combination (D,/D) of the bit value of the latch node N and the bit value of the inversion node/N.

Figure 6A:
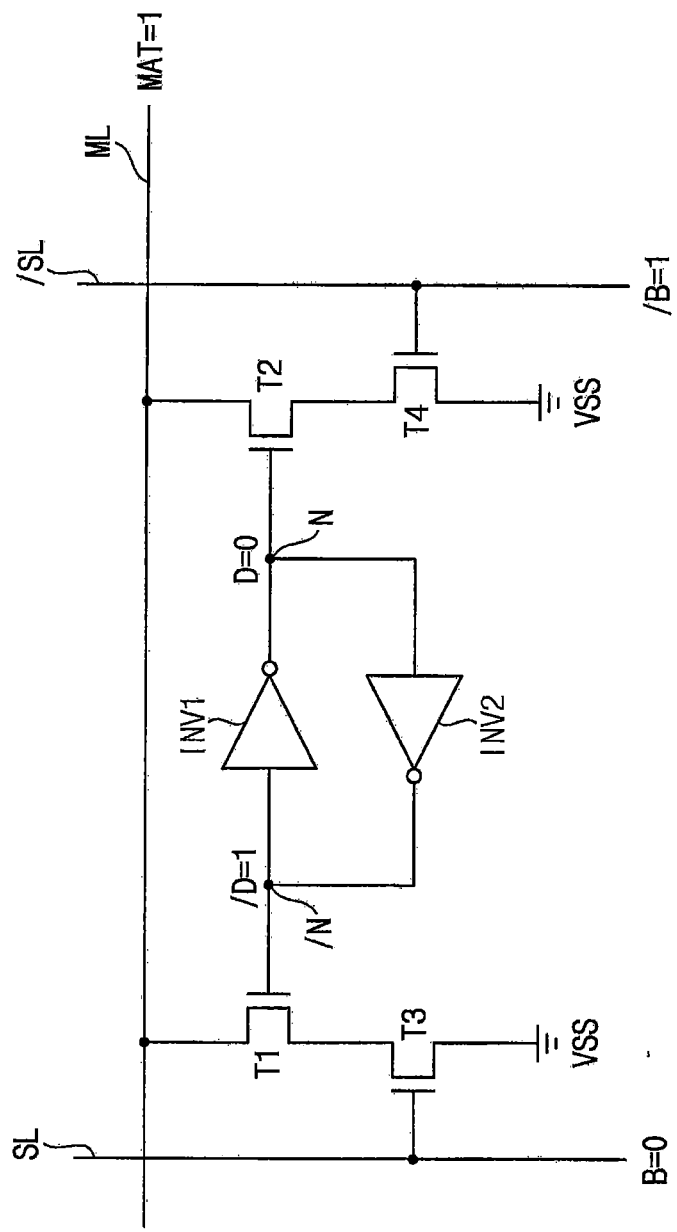
FIGS. 6A, 6B, 7A, 7B, 8A, and 8B are diagrams for describing bit values of searching data applied to a CAM.
Figure 6B:
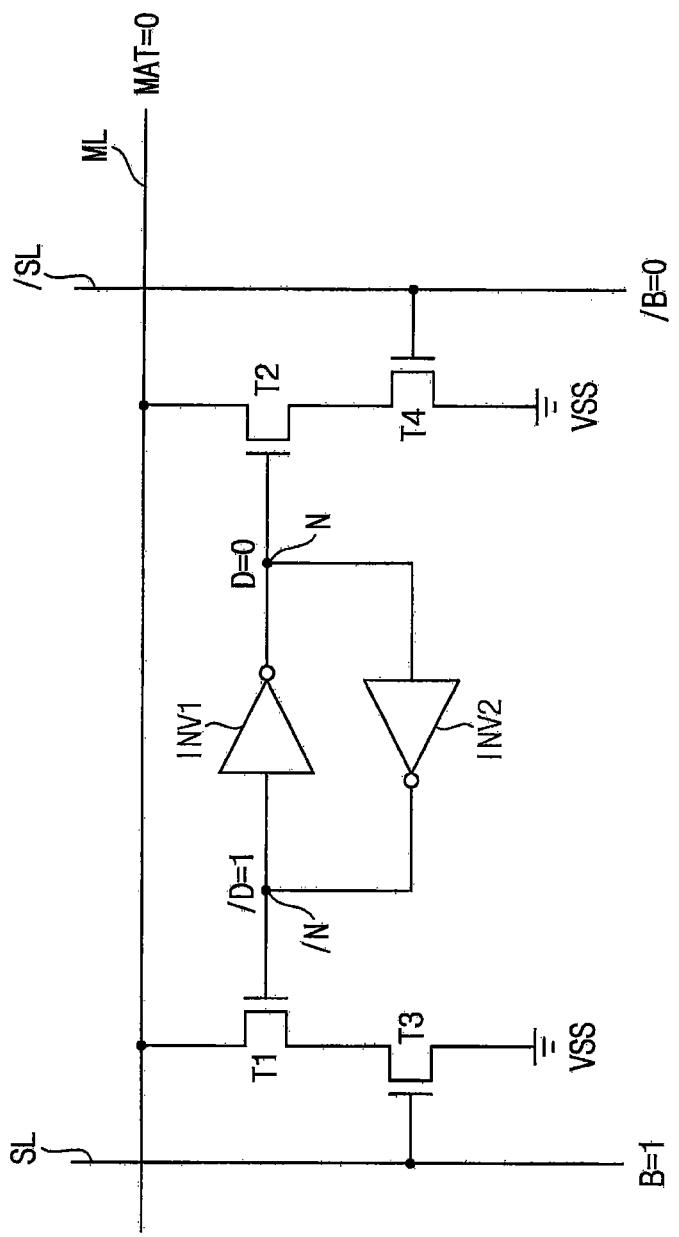

FIGS. 6A and 6B illustrate a case when one bit of the entry data has the value of 0, that is, (D,/D)=(0, 1).

Referring to FIG. 6A, when one bit of the searching data has the value of 0, that is, (SL,/SL)=(0, 1), the first transistor T1 and the fourth transistor T4 are turned on and the second transistor T2 and the third transistor T3 are turned off. As a result, both of the first pull-down path including the first and third transistors T1 and T3 and the second pull-down path including the second transistor T2 and the fourth transistor T4 are disabled and the matching signal MAT maintains the value of 1 indicating the match case that is previously precharged.

Referring to FIG. 6B, when one bit of the searching data has the value of 1, that is, (SL,/SL)=(1, 0), the first transistor T1 and the third transistor T3 are turned on and the second transistor T2 and the fourth transistor T4 are turned off. As a result, the second pull-down path T2 and T4 is disabled but the first pull-down path T1 and T3 is enabled, and the matching signal MAT transitions to the value of 0 indicating the mismatch case.

Figure 7A:
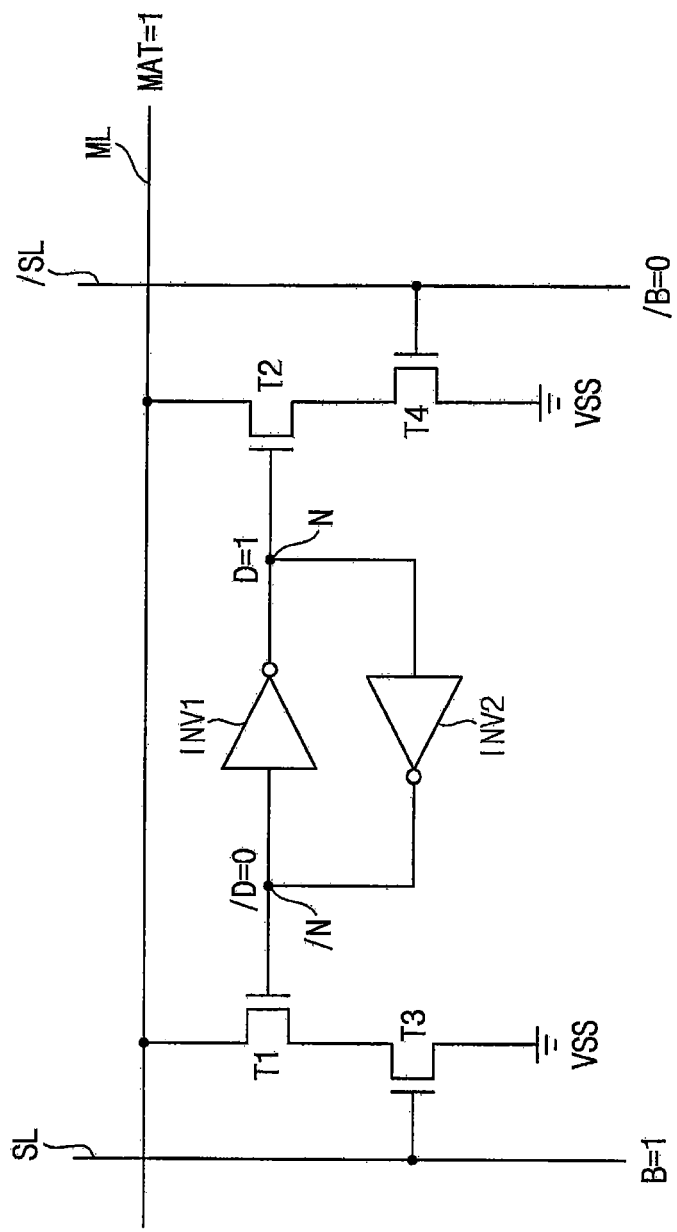
Figure 7B:
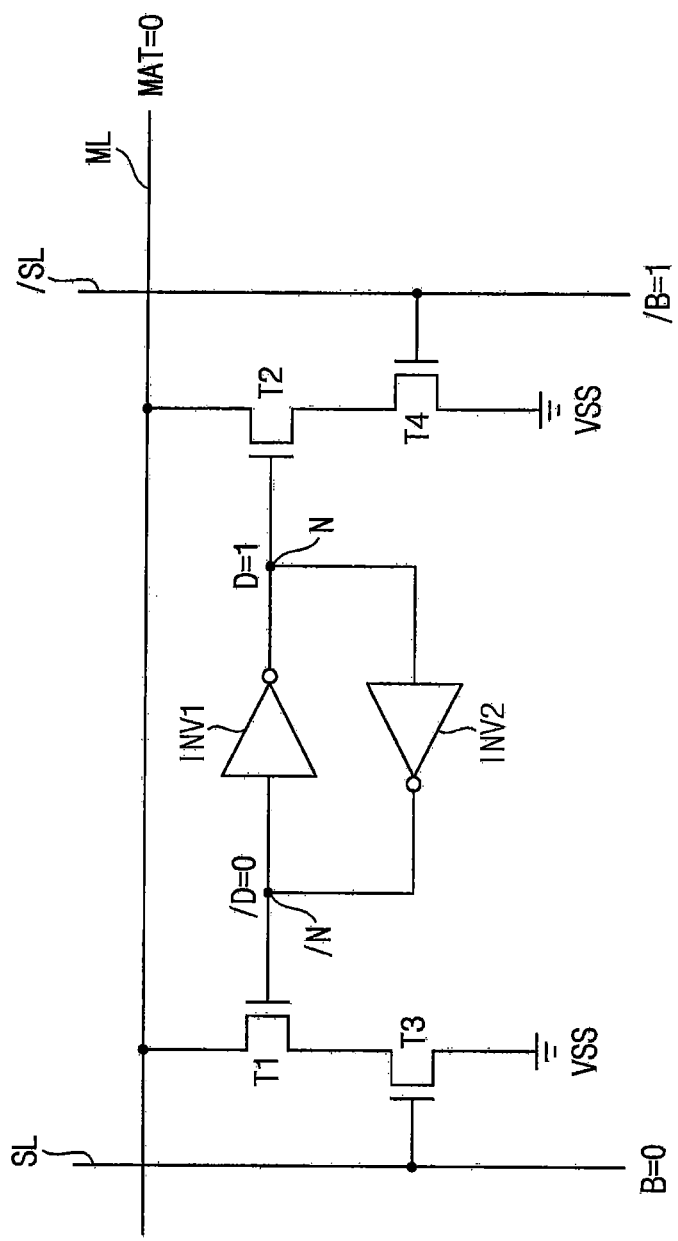

FIGS. 7A and 7B illustrate a case when one bit of the entry data has the value of 1, that is, (D,/D)=(1, 0).

Referring to FIG. 7A, when one bit of the searching data has the value of 1, that is, (SL,/SL)=(1, 0), the first transistor T1 and the fourth transistor T4 are turned off and the second transistor T2 and the third transistor T3 are turned on. As a result, both of the first pull-down path T1 and T3 and the second pull-down path T2 and T4 are disabled and the matching signal MAT maintains the value of 1 indicating the match case that is previously precharged.

Referring to FIG. 7B, when one bit of the searching data has the value of 0, that is, (SL,/SL)=(0, 1), the first transistor T1 and the third transistor T3 are turned off and the second transistor T2 and the fourth transistor T4 are turned on. As a result, the first pull-down path T1 and T3 is disabled but the second pull-down path T2 and T4 is enabled, and the matching signal MAT transitions to the value of 0 indicating the mismatch case.

Figure 8A:
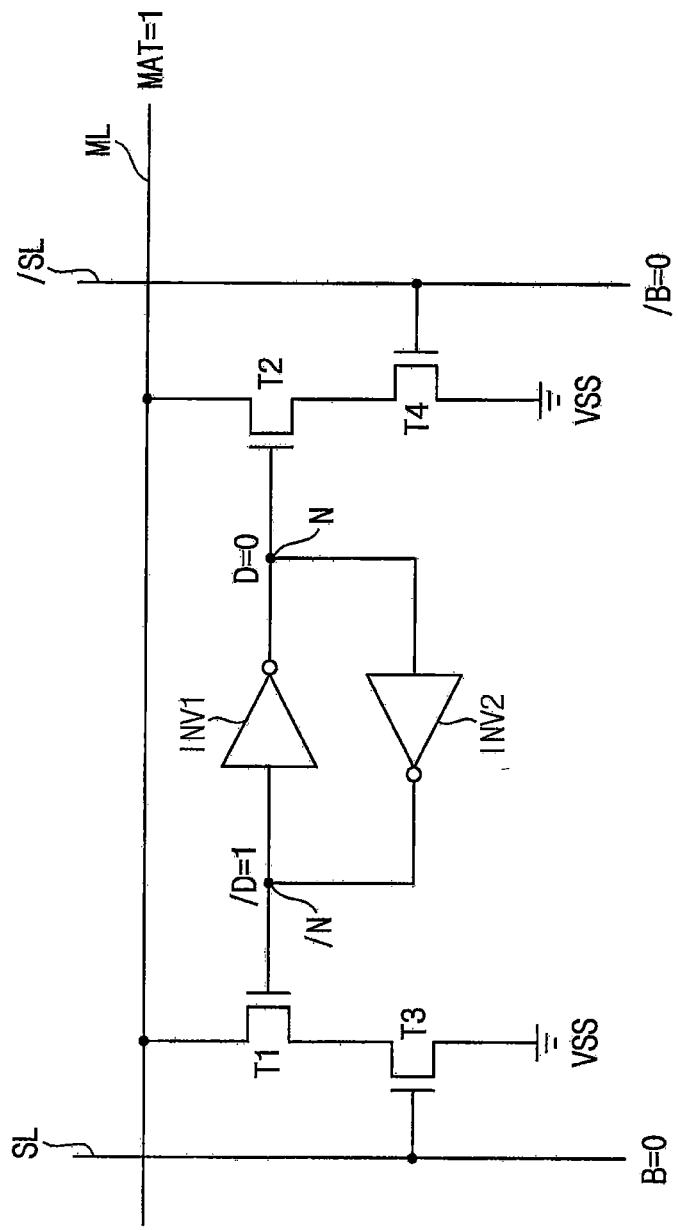
Figure 8B:
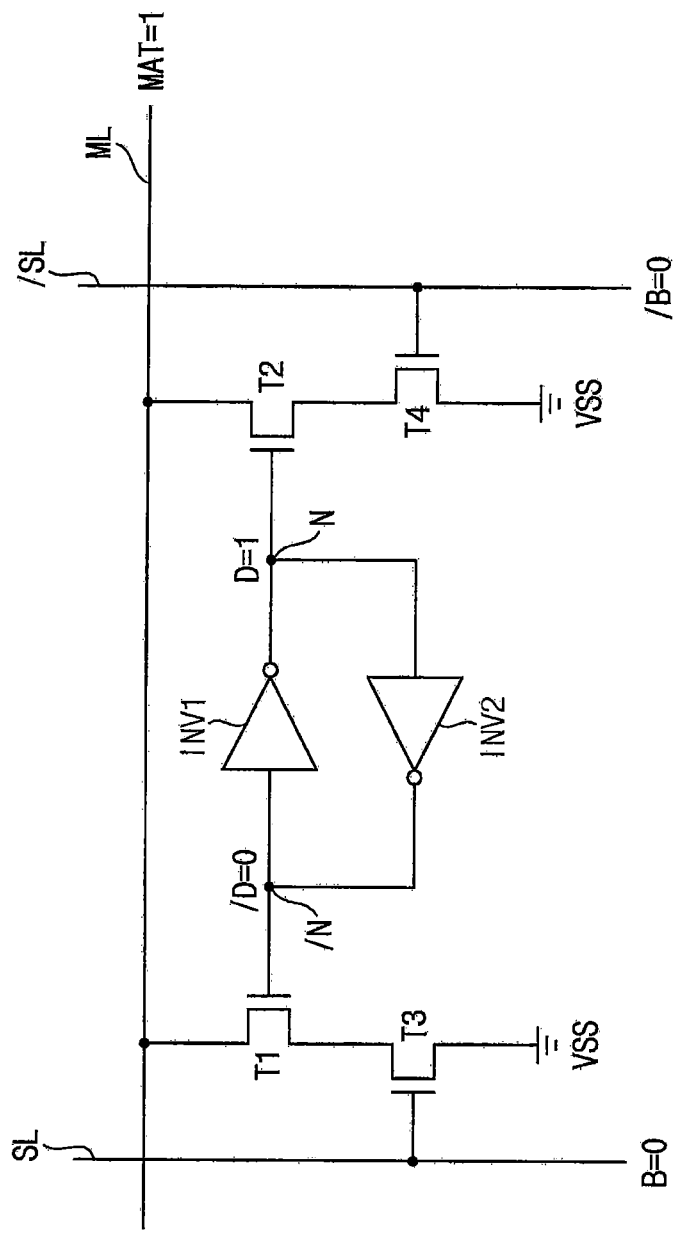

FIGS. 8A and 8B illustrate a case when one bit of the searching data has the don't care value, that is, (SL,/SL)=(0, 0). FIG. 8A illustrates a case when one bit of the entry data has the value of 0, that is, (D,/D)=(0, 1), and FIG. 8B illustrates a case when one bit of the entry data has the value of 1, that is, (D,/D)=(1, 0).

Referring to FIGS. 8A and 8B, the value of 0 is applied to both of the normal searching line SL and the complimentary searching line/SL, and thus the third transistor T3 and the fourth transistor T4 are turned off always regardless and/or independently of the stored bit value of the entry data. Accordingly, when the combination (SL,/SL)=(0, 0) corresponding to the don't care value is applied as the one bit value of the searching data, both of the first pull-down path T1 and T3 and the second pull-down path T2 and T4 are disabled and the matching signal MAT maintains the value of 1.

As described with reference to FIGS. 6A through 7B, the CAM controller 1020 in FIG. 1 may apply the value of 1 to one of the normal searching line SL and the complementary searching line/SL and apply the value of 0 to the other of the normal searching line SL and the complementary searching line/SL, with respect to each of the comparison bits among bits of the searching data. In contrast, as described with reference to FIGS. 8A and 8B, the CAM controller 1020 may apply the value of 0 to both of the normal searching line SL and the complementary searching line/SL, with respect to each of non-comparison bits except the comparison bits among the bits of the searching data. According to the configuration of the CAM cell, the CAM controller 1020 may apply the value of 1 as the don't care value to both of the normal searching line SL and the complementary searching line/SL, with respect to each of the non-comparison bits. For example, if the CAM cell has a configuration such that the matching line may be precharged to the value of 0 instead of the value of 1 and at least one pull-up path is enabled in the mismatch case, the pull-up paths may be disabled regardless and/or independently of the bit value stored in the CAM cell, by applying the value of 1 as the don't care value to both of the normal searching line SL and the complementary searching line/SL.

Hereinafter, referring to FIGS. 9 through 14B, a 1-bit accumulation searching operation according to example embodiments will be described. The 1-bit accumulation searching operation indicates that the above-described partial searching operation is repeated by increasing a number of the comparison bits one by one in a direction from the K-th bit BK to the first bit B1. Using the 1-bit accumulation searching operation, maximum entry data (e.g., an entry data having a maximum value of the entry data) or minimum entry data (e.g., an entry data having a minimum value of the entry data) may be determined as the target entry data among the plurality of entry data stored in the CAM.

Figure 9:
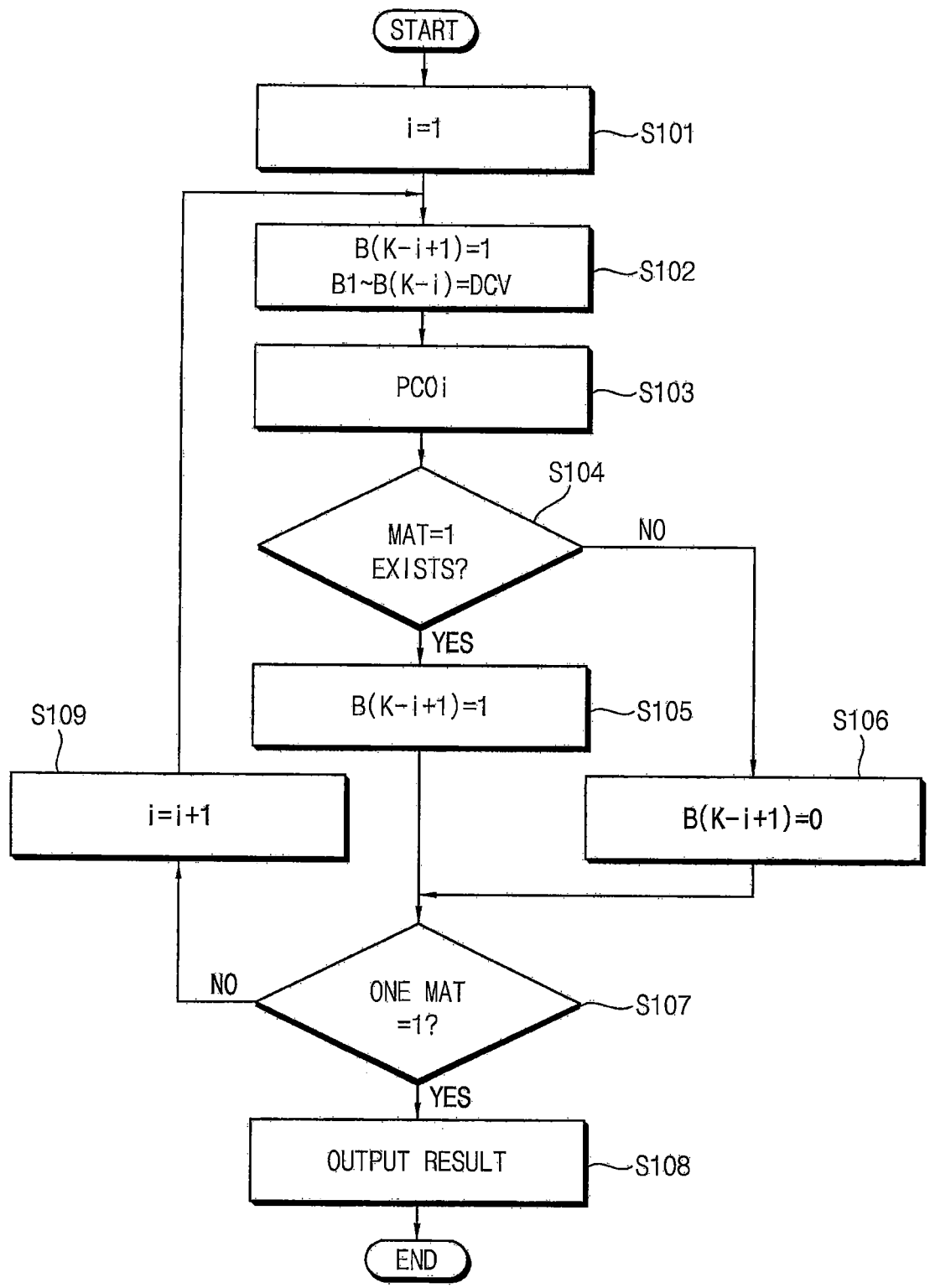
FIG. 9 is a flow chart illustrating a maximum entry searching method using a search circuit according to example embodiments of the present disclosure.

FIG. 9 is a flow chart illustrating a maximum entry searching method using a search circuit according to example embodiments of the present disclosure.

Referring to FIG. 9, the value of i is initialized to 1 (S101). The (K−i+1)-th bit of the searching data is set to 1 and the first through (K−i)-th bits B1 to B(K−i) of the searching data, illustrated in FIG. 9 as B1~B(K−i), are set to the don't care value DCV (S102). After setting the comparison bits and the non-comparison bits as such, the i-th partial searching operation PCOi is performed (S103).

As a result, when the value of i is 1, the first partial searching operation PCO1 is performed (S103) by applying the K-th comparison bit BK having a value of 1 to the CAM.

When at least one of the matching signals MAT is activated (for example, having the value of 1 indicating the match case) (S104: YES), the (K−i+1)-th bit B(K−i+1) of the searching data is set to 1 (S105). When all of the matching signals MAT are deactivated (for example, having the value of 0 indicating the mismatch case) (S104: NO), the (K−i+1)-th bit B(K−i+1) of the searching data is set to 0 (S106). After that, the value of i is increased by one (S109), and the processes (S102 to S106) are repeated.

As such, values of the comparison bits of an (i+1)-th partial searching operation PCO(i+1) when the number of the comparison bits is (i+1) may be determined, based on the plurality of matching signals of an i-th partial searching operation PCOi when the number of the comparison bits is i, where i is a natural number.

In other words, when the target entry data is the maximum entry data, the CAM controller 1020 in FIG. 1 may perform the (i+1)-th partial searching operation PCO(i+1) by applying the K-th through (K−i+1)-th comparison bits to the CAM 1010 such that the CAM controller 1020 sets the value of the (K−i+1)-th comparison bit to 1 when at least one of the plurality of matching signals is activated by the i-th partial searching operation PCOi, and sets the value of the (K−i+1)-th comparison bit to 0 and the value of the (K−i)-th comparison bit to 1 when all of the plurality of matching signals are deactivated by the i-th partial searching operation PCOi.

The recursive processes (S102 to S106 and S109) may be repeated until only one of the plurality of matching signals is activated by the i-th partial searching operation PCOi (S107: NO). When only one of the plurality of matching signals is activated (S107: YES), the CAM controller 1020 may not perform the (i+1)-th partial searching operation PCO(i+1) and the following partial searching operations, e.g., PCO(i+2), PCO(i+3) and so on.

When only one of the plurality of matching signals is activated (S107: YES), the CAM controller 1020 may determine the entry data corresponding to the only one activated matching signal as the maximum entry data, and output the result of the maximum entry searching operation (S108). The result may include the maximum entry data and/or the position information of the maximum entry data.

FIGS. 10A and 10B are diagrams illustrating an example of the maximum entry searching method of FIG. 9.

FIG. 10A illustrates first through fifth entry data ENT1 to ENT5 (e.g., ENT1, ENT2, ENT3, ENT4, and ENT5) stored in the CAM. Each of the first through fifth entry data ENT1 to ENT5 may include a sixth bit B6 corresponding to a most significant bit through a first bit B1 corresponding to a least significant bit. The numbers of the entry data and the bit of each entry data are for convenience of illustration and descriptions and example embodiments of the present disclosure are not limited thereto.

FIG. 10B illustrates a maximum entry searching operation corresponding to the entry data of FIG. 10A.

Referring to FIGS. 10A and 10B, the first partial searching operation PCO1 is performed by applying the sixth bit B6 having the value of 1 as the one comparison bit to the CAM. As illustrated in FIG. 10A, all of the sixth bit B6 of the first through fifth entry data ENT1 to ENT5 are 0, and thus all of the first through fifth matching signals MAT1 to MAT5 have the value of 0 indicating the mismatch case.

Because all of the matching signals MAT1 to MAT5 are deactivated as the result of the first partial searching operation PCO1, the sixth bit B6 of the searching data is set to 0, the fifth bit B5 of the searching data is set to 1, and then the second partial searching operation PCO2 is performed by applying the sixth and fifth bits B6 and B5 as the two comparison bits to the CAM.

Because only the second matching signal MAT2 is activated to the value of 1 indicating the match case as the result of the second partial searching operation PCO2, the second entry data ENT2 corresponding to the second matching signal MAT2 may be determined as the maximum entry data MAXENT.

FIGS. 11A and 11B are diagrams illustrating another example of the maximum entry searching method of FIG. 9.

FIG. 11A illustrates an example of first through fifth entry data ENT1 to ENT5 stored in the CAM, and FIG. 11B illustrates a maximum entry searching operation corresponding to the entry data of FIG. 11A.

Referring to FIGS. 11A and 11B, the first partial searching operation PCO1 is performed by applying the sixth bit B6 having the value of 1 as the one comparison bit to the CAM. All of the sixth bits B6 of the first through fifth entry data ENT1 to ENT5 are 0, and thus all of the first through fifth matching signals MAT1 to MAT5 have the value of 0 indicating the mismatch case.

Because all of the matching signals MAT1 to MAT5 are deactivated as the result of the first partial searching operation PCO1, the sixth bit B6 of the searching data is set to 0, the fifth bit B5 of the searching data is set to 1 and then the second partial searching operation PCO2 is performed by applying the sixth and fifth bits B6 and B5 as the two comparison bits to the CAM.

Because the second matching signal MAT2 and the fourth matching signal MAT4 are activated to the value of 1 indicating the match case as the results of the second partial searching operation PCO2, the fifth bit B5 of the searching data is set to 1, the fourth bit B4 of the searching data is set to 1 and then the third partial searching operation PCO3 is performed by applying the sixth, fifth, and the fourth bits B6, B5, and B4 as the three comparison bits to the CAM.

Because all of the matching signals MAT1 to MAT5 are deactivated as the result of the third partial searching operation PCO3, the fourth bit B4 of the searching data is set to 0, the third bit B3 of the searching data is set to 1, and then the fourth partial searching operation PCO4 is performed by applying the sixth through third bits B6 to B3 as the four comparison bits to the CAM.

Because only the second matching signal MAT2 is activated to the value of 1 indicating the match case as the result of the fourth partial searching operation PCO4, the second entry data ENT2 corresponding to the second matching signal MAT2 may be determined as the maximum entry data MAXENT.

Figure 12:
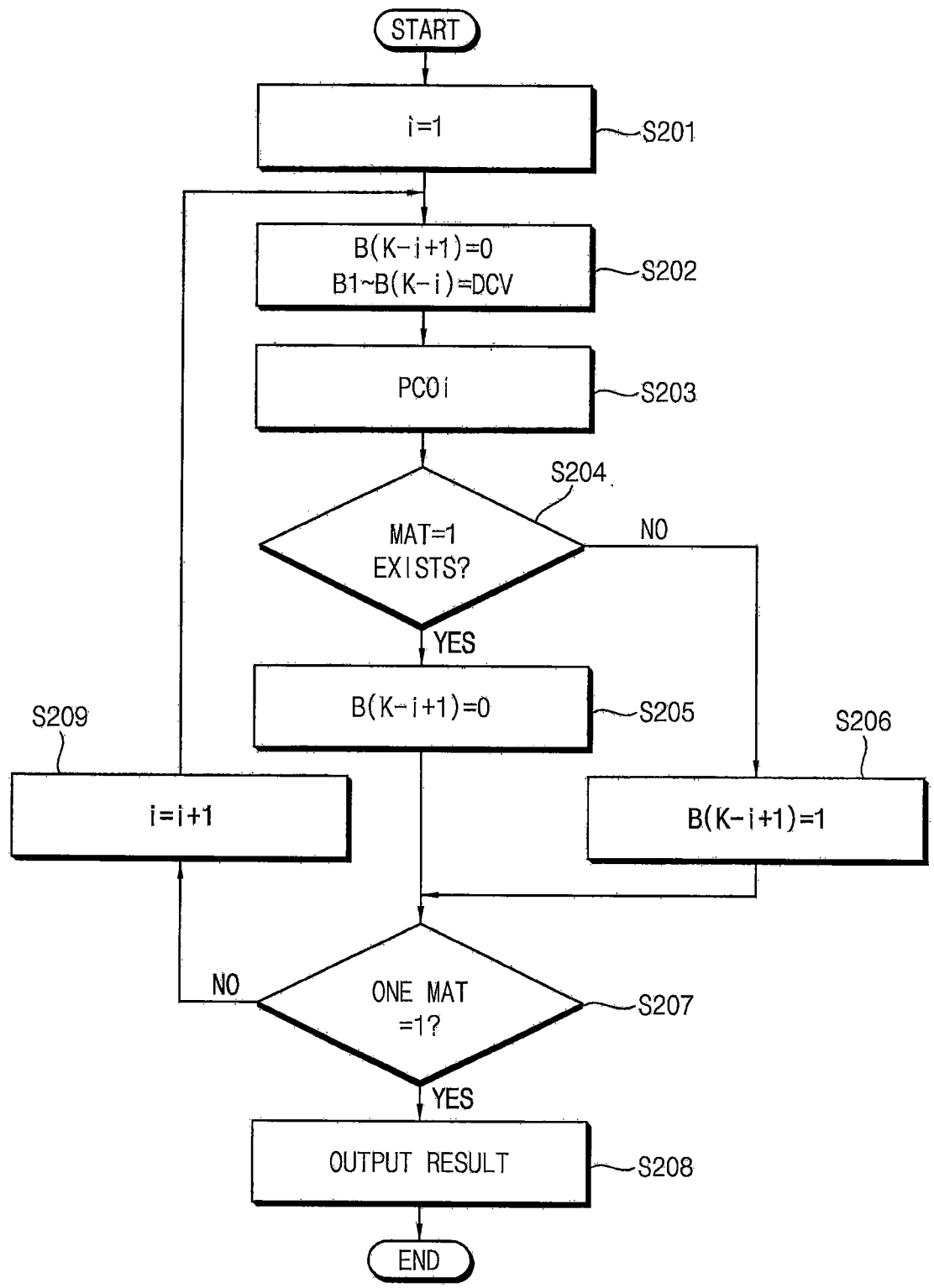
FIG. 12 is a flow chart illustrating a minimum entry searching method using a search circuit according to example embodiments of the present disclosure.

FIG. 12 is a flow chart illustrating a minimum entry searching method using a search circuit according to example embodiments of the present disclosure.

Referring to FIG. 12, the value of i is initialized to 1 (S201). The (K−i+1)-th bit of the searching data is set to 0 and the first through (K−i)-th bits B1 to B(K−i) (illustrated as B1~B(K−i) in FIG. 12) of the searching data are set to the don't care value DCV (S202). After setting the comparison bits and the non-comparison bits as such, the i-th partial searching operation PCOi is performed (S203).

As a result, when the value of i is 1, the first partial searching operation PCO1 is performed (S203) by applying the K-th comparison bit BK having a value of 0 to the CAM.

When at least one of the matching signals MAT is activated (for example, having the value of 1 indicating the match case) (S204: YES), the (K−i+1)-th bit B(K−i+1) of the searching data is set to 0 (S205). When all of the matching signals MAT are deactivated (for example, having the value of 0 indicating the mismatch case) (S204: NO), the (K−i+1)-th bit B(K−i+1) of the searching data is set to 1 (S206). After that, the value of i is increased by one (S109), the processes (S202 to S206) are repeated.

As such, values of the comparison bits of an (i+1)-th partial searching operation PCO(i+1) when the number of the comparison bits is (i+1) may be determined, based on the plurality of matching signals of an i-th partial searching operation PCOi when the number of the comparison bits is i, where i is a natural number.

In other words, when the target entry data is the minimum entry data, the CAM controller 1020 in FIG. 1 may perform the (i+1)-th partial searching operation PCO(i+1) by applying the K-th through (K−i+1)-th comparison bits to the CAM 1010 such that the CAM controller 1020 sets the value of the (K−i+1)-th comparison bit to 0 when at least one of the plurality of matching signals is activated by the i-th partial searching operation PCOi, and sets the value of the (K−i+1)-th comparison bit to 1 and the value of the (K−i)-th comparison bit to 0 when all of the plurality of matching signals are deactivated by the i-th partial searching operation PCOi.

The recursive processes (S202 to S206 and S209) may be repeated until only one of the plurality of matching signals is activated by the i-th partial searching operation PCOi (S207: NO). When only one of the plurality of matching signals is activated (S207: YES), the CAM controller 1020 may not perform the (i+1)-th partial searching operation PCO(i+1) and the following partial searching operations PCO(i+2), PCO(i+3) and so on.

When only one of the plurality of matching signals is activated (S207: YES), the CAM controller 1020 may determine the entry data corresponding to the only one activated matching signal as the minimum entry data, and output the result of the minimum entry searching operation (S208). The result may include the minimum entry data and/or the position information of the minimum entry data.

FIGS. 13A and 13B are diagrams illustrating an example of the minimum entry searching method of FIG. 12.

FIG. 13A illustrates an example of first through fifth entry data ENT1 to ENT5 stored in the CAM, and FIG. 13B illustrates a minimum entry searching operation corresponding to the entry data of FIG. 13A.

Referring to FIGS. 13A and 13B, the first partial searching operation PCO1 is performed by applying the sixth bit B6 having the value of 0 as the one comparison bit to the CAM. As illustrated in FIG. 13A, all of the sixth bit B6 of the first through fifth entry data ENT1 to ENT5 are 0, and thus all of the first through fifth matching signals MAT1 to MAT5 have the value of 1 indicating the match case.

Because at least one of the matching signals MAT1 to MAT5 is activated as the result of the first partial searching operation PCO1, the sixth bit B6 of the searching data is set to 0, the fifth bit B5 of the searching data is set to 0, and then the second partial searching operation PCO2 is performed by applying the sixth and fifth bits B6 and B5 as the two comparison bits to the CAM.

In the same way, because the at least one matching signal is activated to the value of 1 indicating the match case as the result of the second partial searching operation PCO2 and the third partial searching operation PCO3, all of the sixth through third bits B6 to B3 of the searching data are set to 0 and then the fourth partial searching operation PCO4 is performed by applying the sixth through third bits B6 to B3 as the four comparison bits to the CAM.

Because only the first matching signal MAT1 is activated to the value of 1 indicating the match case as the result of the fourth partial searching operation PCO4, the first entry data ENT1 corresponding to the first matching signal MAT1 may be determined as the minimum entry data MINENT.

FIGS. 14A and 14B are diagrams illustrating another example of the minimum entry searching method of FIG. 12.

FIG. 14A illustrates an example of first through fifth entry data ENT1 to ENT5 stored in the CAM, and FIG. 14B illustrates a minimum entry searching operation corresponding to the entry data of FIG. 14A.

Referring to FIGS. 14A and 14B, the first partial searching operation PCO1 is performed by applying the sixth bit B6 having the value of 0 as the one comparison bit to the CAM. All of the sixth bits B6 of the first through fifth entry data ENT1 to ENT5 are 0, and thus all of the first through fifth matching signals MAT1 to MAT5 have the value of 1 indicating the match case.

Because at least one of the matching signals MAT1 to MAT5 is activated as the result of the first partial searching operation PCO1, the sixth bit B6 of the searching data is set to 0, the fifth bit B5 of the searching data is set to 0, and then the second partial searching operation PCO2 is performed by applying the sixth and fifth bits B6 and B5 as the two comparison bits to the CAM.

In the same way, because the at least one matching signal is activated to the value of 1 indicating the match case as the result of the second partial searching operation PCO2 and the third partial searching operation PCO3, all of the sixth through third bits B6 to B3 of the searching data is set to 0 and then the fourth partial searching operation PCO4 is performed by applying the sixth through third bits B6 to B3 as the four comparison bits to the CAM.

Because all of the matching signals are deactivated to the value of 0 indicating the mismatch case as the results of the fourth partial searching operation PCO4, the third bit B3 of the searching data is set to 1, the second bit B2 of the searching data is set to 0 and then the fifth partial searching operation PCO5 is performed by applying the sixth through second bits B6 to B2 as the five comparison bits to the CAM.

Because only the third matching signal MAT2 is activated to the value of 1 indicating the match case as the result of the fifth partial searching operation PCO5, the third entry data ENT3 corresponding to the third matching signal MAT3 may be determined as the minimum entry data MINENT.

Figure 15:
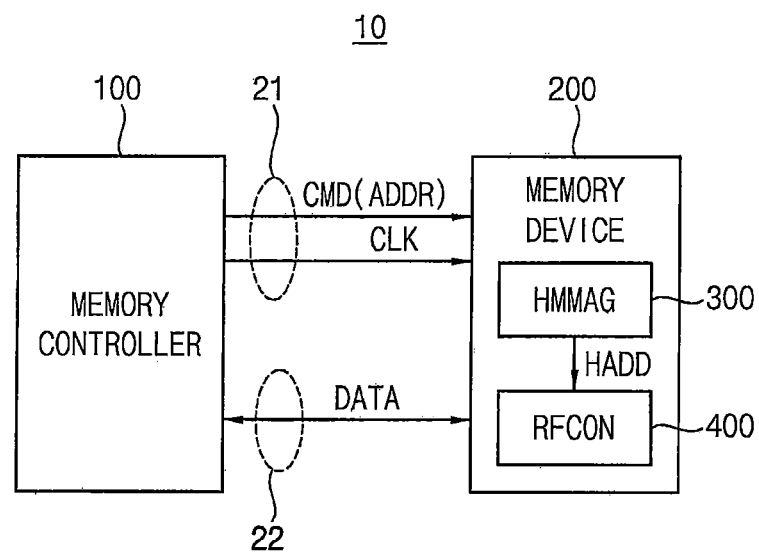
FIGS. 15 and 16 are block diagrams illustrating a memory system according to example embodiments of the present disclosure.
Figure 16:
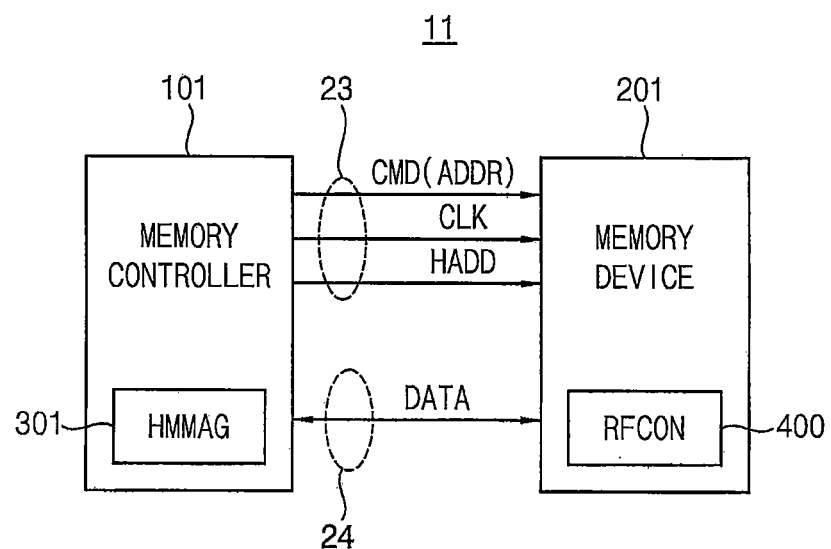

FIGS. 15 and 16 are block diagrams illustrating a memory system 10 according to example embodiments of the present disclosure.

Referring to FIG. 15, a memory system 10 includes a memory controller 100 and a memory device 200. The memory controller 100 and the memory device 200 include respective interfaces for mutual communication. The interfaces may be connected through a control bus 21 for transferring a command CMD, an access address ADDR, a clock signal CLK, etc. and a data bus 22 for transferring data DATA. According to some standards for memory devices, the access address ADDR may be incorporated in the command CMD (e.g., CMD(ADDR)). The memory controller 100 may generate the command CMD to control the memory device 200 and the data DATA may be written in or read from the memory device 200 under the direction and control of the memory controller 100.

The memory device 200 may include a hammer address management circuit HMMAG 300 configured to provide a hammer address HADD and a refresh controller RFCON 400 configured to perform a hammer refresh operation based on the provided hammer address HADD.

Referring to FIG. 16, a memory system 11 includes a memory controller 101 and a memory device 201 which are connected through a control bus 23 and a data bus 24.

In comparison with the memory system 10 of FIG. 15, in the memory system 11 of FIG. 16, the memory controller 101 includes a hammer address management circuit HMMAG 301 configured to provide a hammer address HADD over the control bus 23, and the memory device 201 includes a refresh controller RFCON 400 configured to perform a hammer refresh operation based on the provided hammer address HADD. In this case, the detection of the hammer address HADD is performed by the memory controller 101 and only the hammer refresh operation may be performed by the memory device 201 to distribute the burden related with the hammer refresh operation, and thus the size of the memory device 201 may be reduced and the overall performance of the memory system 11 may be enhanced.

Figure 17:
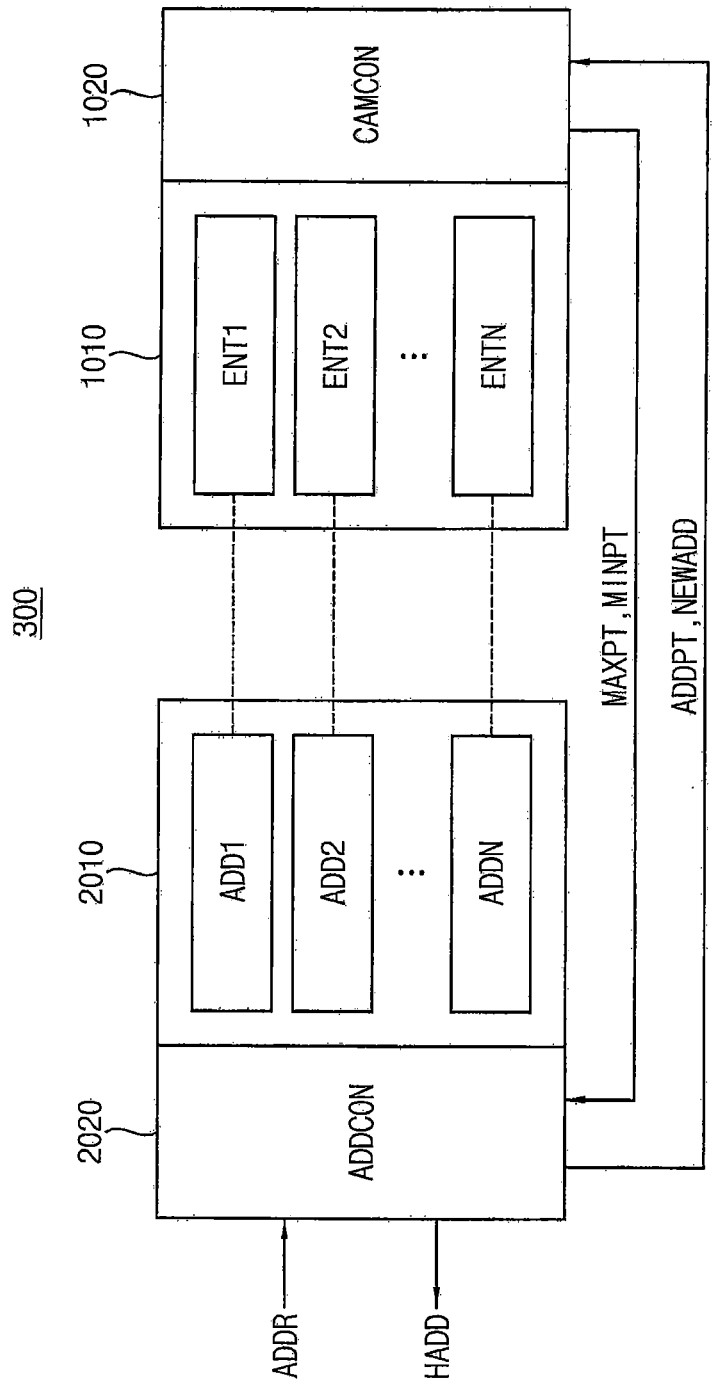
FIG. 17 is a block diagram illustrating a hammer address management circuit according to example embodiments of the present disclosure.

FIG. 17 is a block diagram illustrating a hammer address management circuit according to example embodiments of the present disclosure.

Referring to FIG. 17, a hammer address management circuit 300 may include a content-addressable memory (CAM) 1010, a CAM controller CAMCON 1020, an address storage 2010, and an address controller ADDCON 2020.

The address storage 2010 stores a plurality of row addresses ADD1 to ADDN (e.g., ADD1, ADD2, . . . , ADDN) based on an access address signal ADDR provided to the memory device. The CAM 1010 includes a plurality of CAM cells configured to store a plurality of access count data indicating a plurality of access counts of the plurality of row addresses, where each of the access count data ENT1 to ENTN (e.g., ENT1, ENT2, . . . , ENTN) include a first bit corresponding to a least significant bit through a K-th bit corresponding to a most significant bit. The CAM 1010 provides a plurality of matching signals indicating whether each of the plurality of access count data ENT1 to ENTN matches searching data.

The CAM controller 1020 performs a partial searching operation such that the CAM controller 1020 applies comparison bits corresponding to a portion of the first through K-th bits as the searching data to the CAM and searches for target count data among the plurality of entry data ENT1 to ENTN based on the plurality of matching signals (e.g., the corresponding bits of the target count data matching the comparison bits).

The address controller 2020 provides a hammer address HADD of the memory device that is accessed intensively, based on a result of searching for the target count data.

The CAM controller 1020 may repeat the maximum entry searching operation by repeating the partial searching operation as described with reference to FIGS. 9 through 11B and may determine the maximum count data as the target count data among the plurality of access count data ENT1 to ENTN. The address controller 2020 may determine the row address corresponding to the maximum count data among the stored row addresses ADD1 to ADDN, based on the position information MAXPT provided from the CAM controller 1020.

In addition, the CAM controller 1020 may repeat the minimum entry searching operation by repeating the partial searching operation as described with reference to FIGS. 12 through 14B and may determine the minimum count data as the target count data among the plurality of access count data ENT1 to ENTN. The address controller 2020 may store a new row address in the address storage to replace the row address corresponding to the minimum count data with the new row address, based on the position information MINPT provided from the CAM controller 1020. In other words, the row address of the lower access frequency may be excluded from an object of the hammer address management by deleting it from the address storage 2010.

The CAM controller 1020 may increase or initialize the values of the access count data ENT1 to ENTN based on access information ADDPT and NEWADD provided from the address controller 2020.

In conventional schemes for the hammer refresh operation, counters for storing the access count data and complex circuits including comparators for determining the maximum count data and/or the minimum count data among the plurality of access count data stored in the counters may be used. As an integration degree of the memory device increases, the bits and the number of the access count data to be stored may increase, and also the number of the counters and the number of the comparators may increase. Accordingly the size of the circuit may be increased and design margin may be decreased.

The hammer address management circuit 300 according to example embodiments of the present disclosure may replace the function for comparing the stored data with the partial searching operation for the CAM and thus the size of the memory device may be reduced and the performance of the hammer refresh operation may be enhanced. Though FIG. 17 illustrates a hammer address management circuit 300 such that in FIG. 15, it will be understood that the design of the hammer address management circuit 300 of FIG. 17 may be equally applied to the hammer address management circuit 301 illustrated in FIG. 16 without deviating from the present disclosure.

Figure 18:
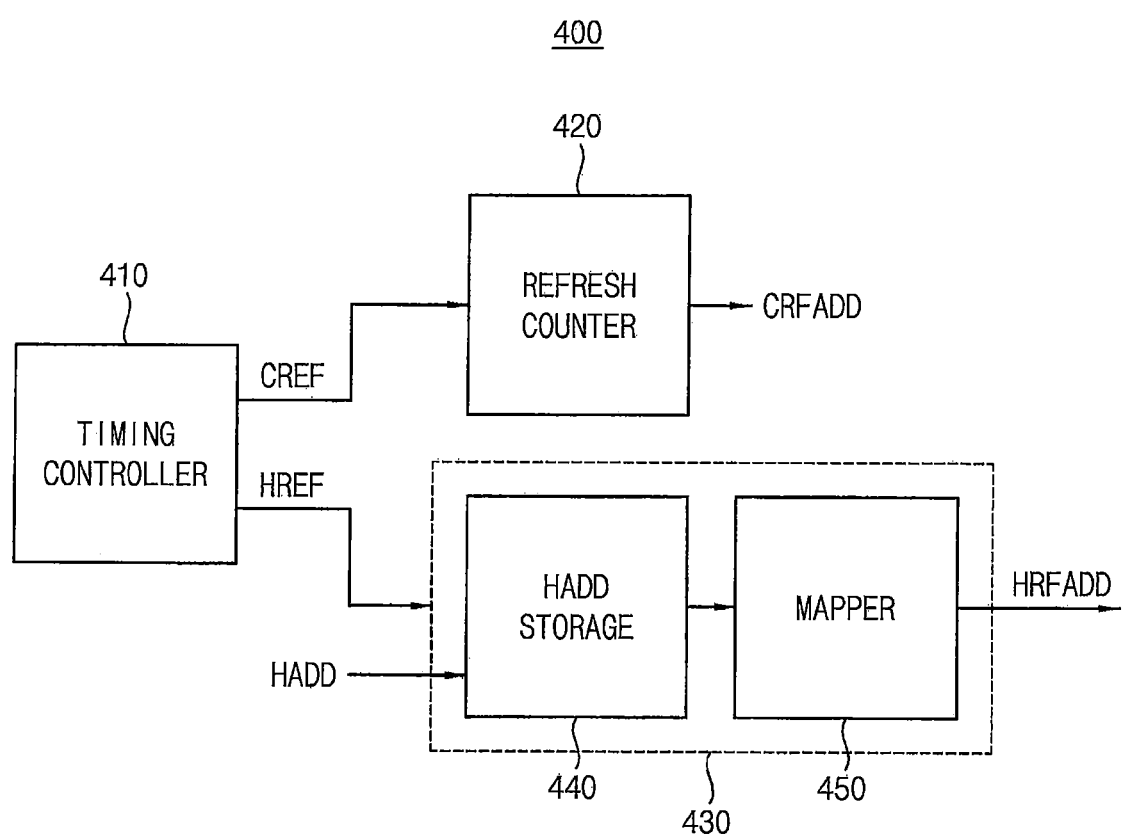
FIG. 18 is a block diagram illustrating a refresh controller included in a memory device according to example embodiments of the present disclosure.

FIG. 18 is a block diagram illustrating a refresh controller included in a memory device according to example embodiments of the present disclosure.

Referring to FIG. 18, the refresh controller 400 may include a timing controller 410, a refresh counter 420, and an address generator 430.

Figure 20A:
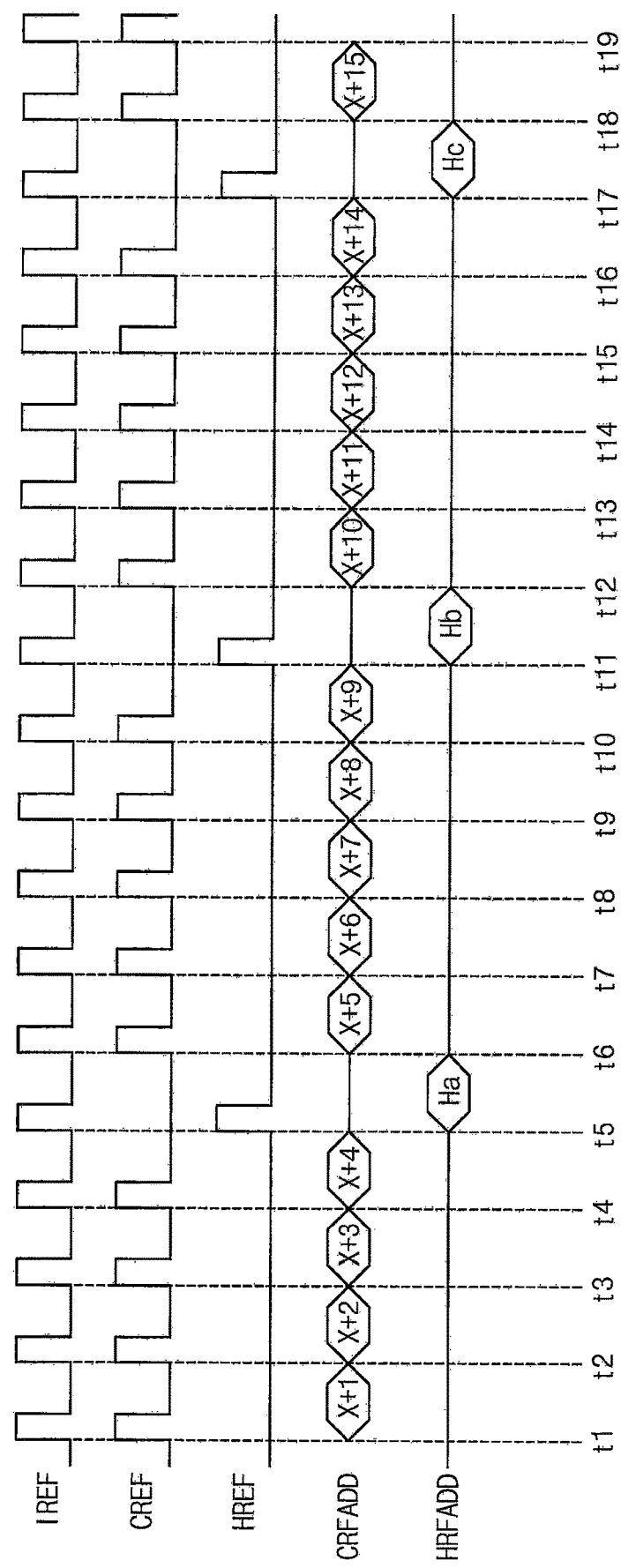
Figure 20B:
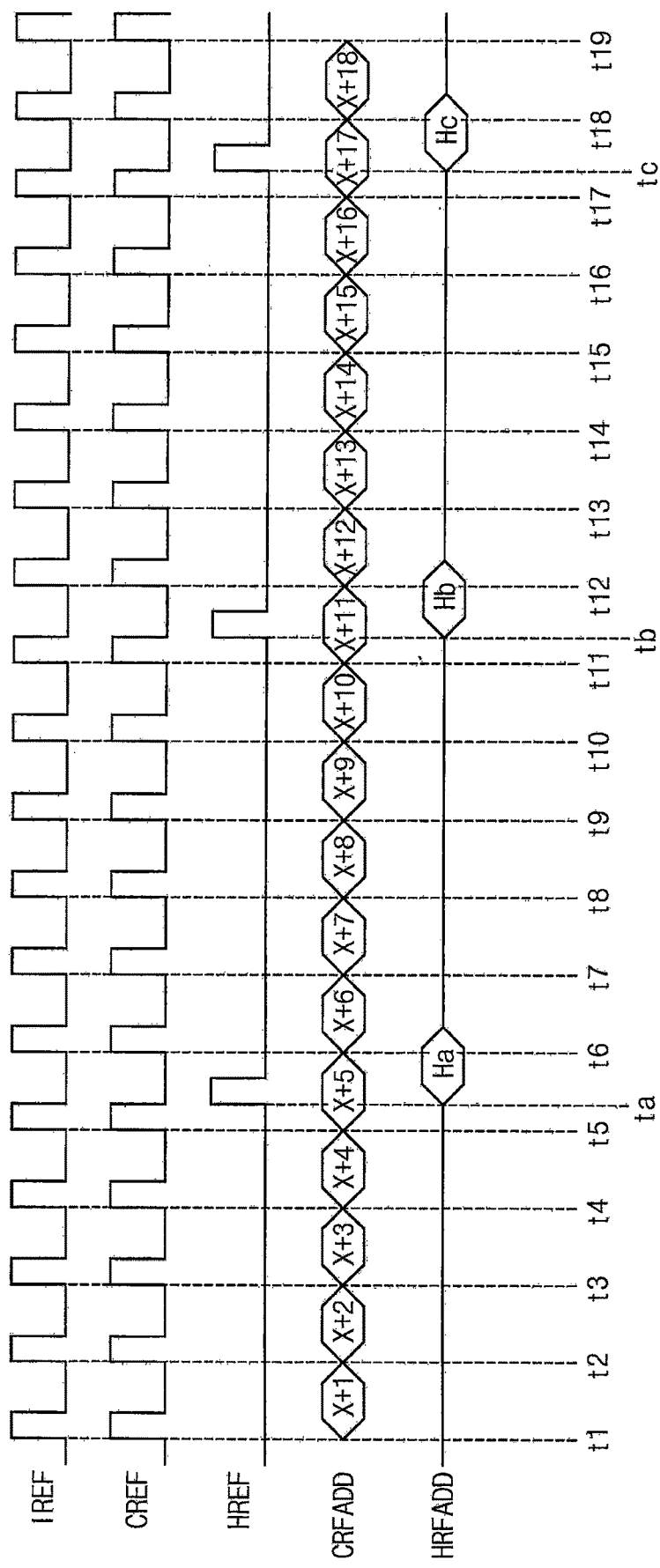

The timing controller 410 may generate a counter refresh signal CREF and a hammer refresh signal HREF representing a timing of the hammer refresh operation based on operational characteristics of the memory device 200. The operation of the timing controller 410 will be further described below with reference to FIGS. 20A, 20B, and 20C. As illustrated in FIGS. 20A, 20B, and 20C, the timing controller 410 may selectively activate one of the counter refresh signal CREF and the hammer refresh signal HREF. The refresh counter 420 may generate a counter refresh address signal CRFADD in response to the counter refresh signal CREF where the counter refresh address signal CRFADD may represent a sequentially changing address. For example, the refresh counter 420 may increase a value of the counter refresh address signal CRFADD whenever the counter refresh signal CREF is activated. Wordlines in a memory cell array of the memory device 200 may be selected sequentially for refresh operations by increasing the value of the counter refresh address signal CRFADD.

The address generator 430 may store the hammer address HADD provided from the memory controller 100 and may generate a hammer refresh address signal HRFADD in synchronization with the hammer refresh signal HREF. The hammer refresh address signal HRFADD may correspond to an address of a row that is physically adjacent to the row corresponding to the hammer address HADD. The address generator 430 may include a hammer address storage 440 and a mapper 450.

The hammer address storage 440 may store the hammer address HADD provided from the memory controller 100.

The mapper 450 may generate the hammer refresh address signal HRFADD based on the hammer address HADD provided from the hammer address storage 440. As will be described below with reference to FIG. 19, the hammer refresh address signal HRFADD may indicate an address of the row of the memory device 200 that is physically adjacent to the row of the memory device corresponding to the hammer address HADD.

Figure 19:
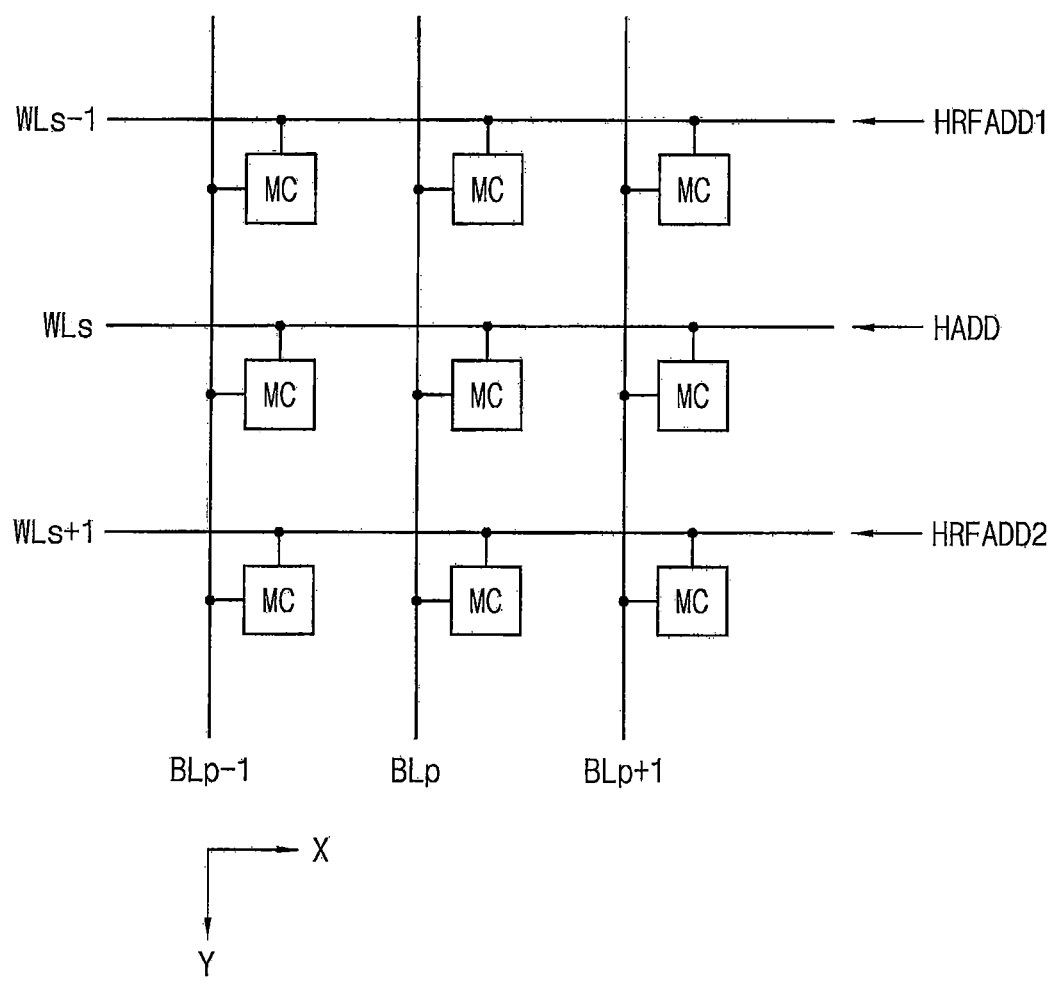
FIG. 19 is a diagram illustrating a portion of a memory cell array for describing a data loss due to wordline coupling.

FIG. 19 is a diagram illustrating a portion of a memory cell array for describing a data loss due to wordline coupling.

FIG. 19 illustrates three wordlines WLs−1, WLs, and WLs+1, three bitlines BLp−1, BLp, and BLp+1, and memory cells MC coupled to the wordlines WLs−1, WLs, and WLs+1 and the bitlines BLp−1, BLp, and BLp+1 in the memory cell array. The three wordlines WLs−1, WLs, and WLs+1 are extended in a row direction (e.g., X direction) and arranged sequentially along a column direction (e.g., Y direction). The three bitlines BLp−1, BLp, and BLp+1 are extended in the column direction and arranged sequentially along the row direction. It will be understood here that the wordlines WLs−1 and WLs are directly physically adjacent to each other since there are no intervening wordlines between the wordlines WLs−1 and WLs.

For example, the middle wordline WLs may correspond to the hammer address HADD that has been accessed intensively. It will be understood that an intensively-accessed or hammer wordline refers to a wordline that has a relatively higher activation number and/or has a relatively higher activation frequency (e.g., greater than a predetermined threshold). Whenever the hammer wordline (e.g., the middle wordline WLs) is accessed, the hammer wordline WLs is enabled and precharged, and the voltage level of the hammer wordline WLs is increased and decreased. Wordline coupling may cause the voltage levels of the adjacent wordlines WLs−1 and WLs+1 to fluctuate as the voltage level of the hammer wordline WLs varies, and thus, the cell charges of the memory cells MC coupled to the adjacent wordlines WLs−1 and WLs+1 may be affected. As the hammer wordline WLs is accessed more frequently, the cell charges of the memory cells MC coupled to the adjacent wordlines WLs−1 and WLs+1 may be lost more rapidly.

The address generator 430 of FIG. 18 may provide the hammer refresh address signal HRFADD representing addresses HRFADD1 and HRFADD2 of the rows (e.g., the wordlines WLs−1 and WLs+1) that are physically adjacent to the row of the hammer address HADD (e.g., the middle wordline WLs), and a refresh operation for the adjacent wordlines WLs−1 and WLs+1 may be performed based on (e.g., in response to) the hammer refresh address signal HRFADD to reduce or possibly prevent the loss of data stored in the memory cells MC.

FIGS. 20A, 20B, and 20C are timing diagrams illustrating example operations of a refresh controller included in a memory device according to example embodiments of the present disclosure.

FIGS. 20A, 20B, and 20C illustrate generation of the counter refresh signal CREF, the hammer refresh signal HREF, the counter refresh address signal CRFADD, and the hammer refresh address signal HRFADD, with respect to a refresh signal IREF that is activated with a pulse shape. The intervals between activation time points t1 to t19 of the refresh signal IREF may be regular or irregular.

Referring to FIGS. 18 and 20A, the timing controller 410 may activate the counter refresh signal CREF in synchronization with time points t1 to t4, t6 to t10, t12 to t16, and t18 to t19 among the activation time points t1 to t19 of the refresh signal IREF, and may activate the hammer refresh signal HREF in synchronization with the time points t5, t11, and t17. Even though FIG. 20A illustrates that the counter refresh signal CREF is activated five times for each activation of the hammer refresh signal HREF, the activation ratio of the counter refresh signal CREF and the hammer refresh signal HREF may be changed.

The refresh counter 420 may generate the counter refresh address signal CRFADD representing the sequentially changing addresses X+1 to X+15 in synchronization with the activation time points t1 to t4, t6 to t10, t12 to t16, and t18 to t19 of the counter refresh signal CREF. The address generator 430 may generate the hammer refresh address signal HRFADD representing the address Ha, Hb, and Hc of the rows that are physically adjacent to the row of the hammer address HADD in synchronization with the activation time points t5, t11, and t17 of the hammer refresh signal HREF.

As illustrated in FIG. 20A, the mapper 450 in the address generator 430 may provide an address corresponding to one of the two adjacent rows. For example, the address Ha may be smaller than the hammer address HADD by 1 at the time point t5, and the address Hb may be larger than the hammer address HADD by 1 at the time point t11. As such, the mapper 450 may alternatively provide the smaller address or the larger address with respect to the hammer address signal at each activation time point of the hammer refresh signal HREF.

The timing diagrams of FIGS. 20B and 20C are similar to the timing diagram of FIG. 20A, and the repeated description are omitted. The counter refresh signal CREF is deactivated in FIG. 20A at certain time points, but the counter refresh signal CREF may be activated periodically regardless of the hammer refresh signal HREF as illustrated in FIG. 20B. According to example embodiments, as illustrated in FIG. 20C, the mapper 450 in the address generator 430 may sequentially provide the addresses corresponding to the two adjacent rows. For example, the address Ha1 may be smaller than the hammer address HADD by 1 at time point t5, and the address Hat may be larger than the hammer address HADD by 1 at time point t6. As such, the mapper 450 may alternatively provide the smaller address or the larger address with respect to the hammer address signal at each activation time point of the hammer refresh signal HREF.

Figure 21:
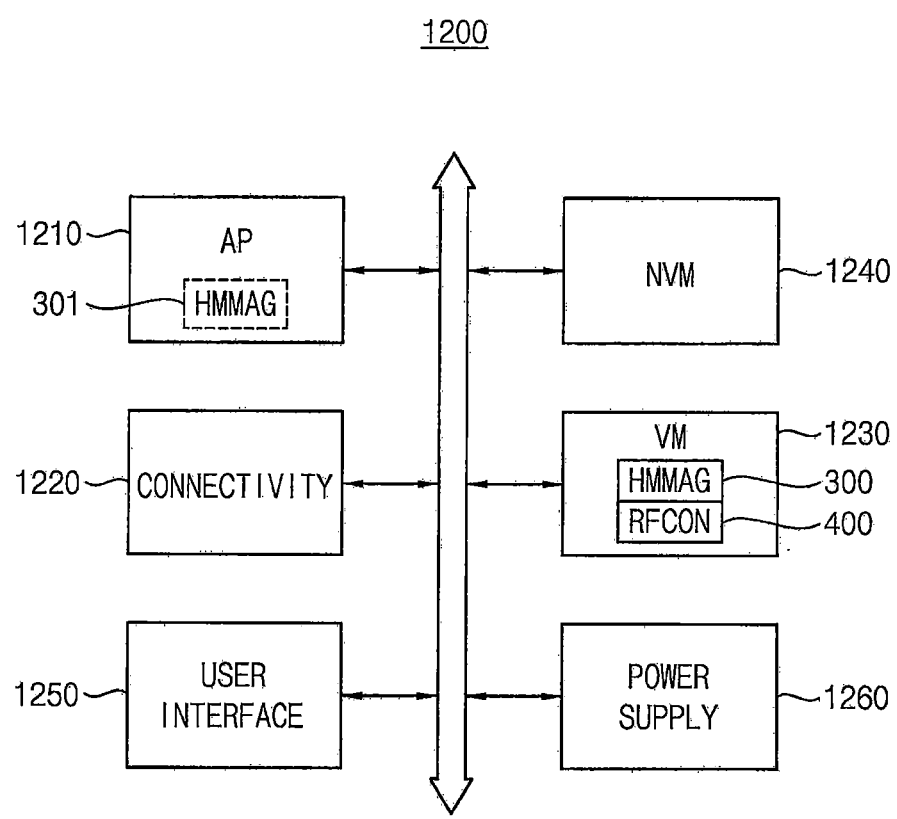
FIG. 21 is a block diagram illustrating a mobile system according to example embodiments of the present disclosure.

FIG. 21 is a block diagram illustrating a mobile system 1200 according to example embodiments of the present disclosure.

Referring to FIG. 21, a mobile system 1200 includes an application processor (AP) 1210, a connectivity unit 1220, a volatile memory device (VM) 1230, a nonvolatile memory device (NVM) 1240, a user interface 1250, and a power supply 1260.

The application processor 1210 may execute applications such as a web browser, a game application, a video player, etc. The connectivity unit 1220 may perform wired or wireless communication with an external device. The volatile memory device 1230 may store data processed by the application processor 1210 or may operate as a working memory. The nonvolatile memory device 1240 may store a boot image for booting the mobile system 1200. The user interface 1250 may include at least one input device, such as a keypad, a touch screen, etc., and at least one output device, such as a speaker, a display device, etc. The power supply 1260 may supply a power supply voltage to the mobile system 1200.

In some example embodiments, as described with reference to FIG. 15, the memory device 1230 may include a hammer address management circuit 300 and a refresh controller 400. In other example embodiments, as described with reference to FIG. 16, the application processor 1210 configured to control the memory device 1230 may include the hammer address management circuit 301 and the memory device 1230 may include the refresh controller 400.

The hammer address management circuit 300, 301 may search for the maximum and minimum values using the search circuit among the stored access count data and thus the size of the hammer address management circuit 300, 301 may be reduced.

The present disclosure may be applied to any electronic devices and systems requiring a data search function. For example, the present disclosure may be applied to systems such as a memory card, a solid state drive (SSD), an embedded multimedia card (eMMC), a universal flash storage (UFS), a mobile phone, a smart phone, a personal digital assistant (PDA), a portable multimedia player (PMP), a digital camera, a camcorder, a personal computer (PC), a server computer, a workstation, a laptop computer, a digital TV, a set-top box, a portable game console, a navigation system, a wearable device, an internet of things (IoT) device, an internet of everything (IoE) device, an e-book, a virtual reality (VR) device, an augmented reality (AR) device, etc.

The foregoing is illustrative of example embodiments and is not to be construed as limiting thereof. Although a few example embodiments have been described, those skilled in the art will readily appreciate that many modifications are possible in the example embodiments without materially departing from the present disclosure.

What is claimed is:

1. A search circuit comprising:
a content-addressable memory (CAM) comprising a plurality of CAM cells configured to store a plurality of entry data, each entry data comprising a first bit corresponding to a least significant bit through a K-th bit corresponding to a most significant bit, the CAM configured to provide a plurality of matching signals indicating whether each of the plurality of entry data matches searching data; and
a CAM controller configured to perform a partial searching operation such that the CAM controller applies comparison bits corresponding to a subset of the first through K-th bits that is less than all of the first through K-th bits as the searching data to the CAM and searches for target entry data among the plurality of entry data based on the plurality of matching signals indicating that the corresponding bits of the target entry data match the comparison bits.

2. The search circuit of claim 1, wherein the CAM controller is further configured to repeat the partial searching operation by changing the comparison bits until the target entry data are determined.

3. The search circuit of claim 1, wherein the CAM controller is further configured to repeat the partial searching operation by increasing a number of the comparison bits one by one in a direction from the K-th bit to the first bit to determine maximum entry data having a maximum value among the entry data or to determine minimum entry data having a minimum value among the entry data as the target entry data.

4. The search circuit of claim 3, wherein the CAM controller is further configured to determine values of (i+1) comparison bits of an (i+1)-th partial searching operation based on the plurality of matching signals of an i-th partial searching operation having i comparison bits, where i is a natural number.

5. The search circuit of claim 4, wherein the CAM controller is further configured to not perform the (i+1)-th partial searching operation responsive to only one of the plurality of matching signals being activated by the i-th partial searching operation.

6. The search circuit of claim 3, wherein, responsive to the target entry data being the maximum entry data, the CAM controller is further configured to perform a first partial searching operation by applying the K-th comparison bit having a value of 1 to the CAM.

7. The search circuit of claim 6, wherein, responsive to the target entry data being the maximum entry data having the maximum value among the entry data, the CAM controller is further configured to perform the (i+1)-th partial searching operation by applying the K-th through (K−i+1)-th comparison bits to the CAM such that the CAM controller is further configured to set the value of the (K−i+1)-th comparison bit to 1 responsive to at least one of the plurality of matching signals being activated by the i-th partial searching operation, and is further configured to set the value of the (K−i+1)-th comparison bit to 0 and the value of the (K−i)-th comparison bit to 1 responsive to all of the plurality of matching signals being deactivated by the i-th partial searching operation.

8. The search circuit of claim 7, wherein, responsive to only one of the plurality of matching signals being activated, the CAM controller is further configured to determine the entry data corresponding to the only one activated matching signal as the maximum entry data having the maximum value among the entry data.

9. The search circuit of claim 3, wherein, responsive to the target entry data being the minimum entry data having the minimum value among the entry data, the CAM controller is further configured to perform a first partial searching operation by applying the K-th comparison bit having a value of 0 to the CAM.

10. The search circuit of claim 9, wherein, responsive to the target entry data being the minimum entry data having the minimum value among the entry data, the CAM controller is further configured to perform the (i+1)-th partial searching operation by applying the K-th through (K−i+1)-th comparison bits to the CAM such that the CAM controller is further configured to set the value of the (K−i+1)-th comparison bit to 0 when at least one of the plurality of matching signals is activated by the i-th partial searching operation, and is further configured to set the value of the (K−i+1)-th comparison bit to 1 and the value of the (K−i)-th comparison bit to 0 when all of the plurality of matching signals are deactivated by the i-th partial searching operation.

11. The search circuit of claim 10, wherein, responsive to only one of the plurality of matching signals being activated, the CAM controller is further configured to determine the entry data corresponding to the only one activated matching signal as the minimum entry data having the minimum value among the entry data.

12. The search circuit of claim 1, wherein the CAM comprises a binary CAM (BCAM) that stores a value of 0 or a value of 1 to each bit of the first through K-th bits of the plurality of entry data.

13. The search circuit of claim 12, wherein the CAM cells corresponding to each of the first through K-th bits of the plurality of entry data are configured to receive each bit of the searching data through a normal searching line and a complementary searching line.

14. The search circuit of claim 13, wherein the CAM controller is further configured to apply a value of 1 to one of the normal searching line and the complementary searching line and to apply a value of 0 to the other of the normal searching line and the complementary searching line, with respect to each of the comparison bits among bits of the searching data, and
wherein the CAM controller is further configured to apply the value of 1 or the value of 0 to both of the normal searching line and the complementary searching line, respectively, with respect to each of non-comparison bits among the bits of the searching data.

15. A memory system comprising:
a memory cell array comprising a plurality of memory cells;
a hammer address management circuit configured to determine a hammer address of the memory cell array that is accessed intensively; and
a refresh controller configured to perform a hammer refresh operation to refresh a first row of the memory cell array that is physically adjacent to a second row of the memory cell array corresponding to the hammer address, wherein the hammer address management circuit comprises:
an address storage configured to store a plurality of row addresses based on an access address signal;

a content-addressable memory (CAM) comprising a plurality of CAM cells configured to store a plurality of access count data indicating a plurality of access counts of the plurality of row addresses, each access count data comprising a first bit corresponding to a least significant bit through a K-th bit corresponding to a most significant bit, the CAM configured to provide a plurality of matching signals indicating whether each of the plurality of access count data matches searching data;

a CAM controller configured to perform a partial searching operation such that the CAM controller applies comparison bits corresponding to a portion of the first through K-th bits as the searching data to the CAM and searches for target count data among the plurality of access count data based on the plurality of matching signals indicating that the corresponding bits of the target count data match the comparison bits; and an address controller configured to provide the hammer address among the plurality of row addresses stored in the address storage, based on a result of searching for the target count data.

16. The memory system of claim 15, wherein the CAM controller is further configured to repeat the partial searching operation by increasing a number of the comparison bits one by one in a direction from the K-th bit to the first bit to determine maximum count data having a maximum value among the access count data or minimum count data having a minimum value among the access count data as the target count data.

17. The memory system of claim 15, wherein the CAM controller is further configured to repeat the partial searching operation to determine maximum count data having a maximum value among the plurality of access count data as the target count data, and wherein the address controller is further configured to provide the row address corresponding the maximum count data as the hammer address.

18. The memory system of claim 15, wherein the CAM controller is further configured to repeat the partial searching operation to determine maximum count data having a maximum value among the plurality of access count data as the target count data, and wherein the address controller is further configured to store a new row address in the address storage to replace the row address corresponding to the minimum count data with the new row address.

19. The memory system of claim 15, wherein the CAM comprises a binary CAM (BCAM) that stores a value of 0 or a value of 1 to each bit of the first through K-th bits of the plurality of access count data.

20. A hammer address management circuit of a memory system, comprising:

an address storage configured to store a plurality of row addresses based on an access address signal provided to a memory device;

a content-addressable memory (CAM) comprising a plurality of CAM cells configured to store a plurality of access count data indicating a plurality of access counts of the plurality of the plurality of row addresses, each access count data including a first bit corresponding to a least significant bit through a K-th bit corresponding to a most significant bit, the CAM configured to provide a plurality of matching signals indicating whether each of the plurality of access count data matches searching data;

a CAM controller configured to perform a partial searching operation such that the CAM controller applies comparison bits corresponding to a portion of the first through K-th bits as the searching data to the CAM and search for target count data among the plurality of access count data based on the plurality of matching signals indicating that the corresponding bits of the target count data match the comparison bits; and an address controller configured to provide a hammer address of the memory device that is accessed intensively, based on a result of searching for the target count data.

* * * * *